(12) United States Patent
Whatmough et al.

(10) Patent No.: US 8,639,975 B2
(45) Date of Patent: Jan. 28, 2014

(54) ERROR MANAGEMENT WITHIN A DATA PROCESSING SYSTEM

(75) Inventors: Paul Nicholas Whatmough, Cambridge (GB); David Michael Bull, Balsham (GB); Shidhartha Das, Norwich (GB); Daniel Kershaw, Cambridge (GB)

(73) Assignee: ARM Limited, Cambridge (GB)

( * ) Notice: Subject to any disclaimer, the term of this patent is extended or adjusted under 35 U.S.C. 154(b) by 589 days.

(21) Appl. No.: 12/926,436

(22) Filed: Nov. 17, 2010

(65) Prior Publication Data

US 2012/0124421 A1 May 17, 2012

(51) Int. Cl.
*G06F 11/00* (2006.01)

(52) U.S. Cl.
USPC .................................. 714/21; 714/15; 714/49

(58) Field of Classification Search
USPC ....................................... 714/1, 49, 15, 21, 26
See application file for complete search history.

(56) References Cited

U.S. PATENT DOCUMENTS

| | | | | |
|---|---|---|---|---|
| 2004/0268189 | A1* | 12/2004 | Constantinescu | 714/704 |
| 2009/0249175 | A1* | 10/2009 | Chandra et al. | 714/822 |
| 2010/0077402 | A1* | 3/2010 | Akgul et al. | 718/104 |

OTHER PUBLICATIONS

T. Austin et al, "Opportunities and Challenges for Better Than Worst-Case Design" Proceedings of the 2005 Asia and South Pacific Design Automation Conference, Jan. 2005, ASP-DAC 2005, pp. 2-7.

A.K. Verma et al, "Variable Latency Speculative Addition: A New Paradigm for Arithmetic Circuit Design" Proceedings of the Conference on Design, Automation and Test in Europe, Mar. 2008.
D.J. Kinniment, "An Evaluation of Asynchronous Addition" IEEE Transactions on Very Large Scale Integration (VLSI) Systems, vol. 4, No. 1, Mar. 1996, pp. 137-140.
S. Das et al, "RazorII: In Situ Error Detection and Correction for PVT and SER Tolerance" IEEE Journal of Solid-State Circuits, vol. 44, No. 1, Jan. 2009, pp. 32-48.
G. Dasika et al, "DVFS in Loop Accelerators Using BLADES" IEEE/ACM Design Automation Conf., Jun. 2008, pp. 894-897.
R. Hegde et al, "Soft Digital Signal Processing" IEEE Transactions on Very Large Scale Integration (VLSI) Systems, vol. 9, No. 6, Dec. 2001, pp. 813-823.
R. Hegde et al, "A Voltage Overscaled Low-Power Digital Filter IC" IEEE Journal of Solid-State Circuits, vol. 39, No. 2, Feb. 2004, pp. 388-391.
B. Shim et al, "Reliable Low-Power Digital Signal Processing via Reduced Precision Redundancy" IEEE Transactions on Very Large Scale Integration (VLSI) Systems, vol. 12, No. 5, May 2004, pp. 497-510.

(Continued)

*Primary Examiner* — Joshua Lohn
(74) *Attorney, Agent, or Firm* — Nixon & Vanderhye P.C.

(57) ABSTRACT

A data processing system 2 is used to perform processing operations to generate a result value. The processing circuitry which generates the result value has an error resistant portion 32 and an error prone portion 30. The probability of an error in operation of the error prone portion for a given set of operating parameters (clk, V) is greater than the probability of an error for that same set of operating parameters within the error resistant portion. Error detection circuitry 38 detects any errors arising in the error prone portion. Parameter control circuitry 40 responds to detected errors to adjust the set of operating parameters to maintain a non-zero error rate in the errors detected by the error detection circuitry. Errors within the one or more bits generated by the error prone portion are not corrected as the apparatus is tolerant to errors occurring within such bit values of the result value.

22 Claims, 15 Drawing Sheets

(56) References Cited

OTHER PUBLICATIONS

L. Wang et al, "Low-Power Filtering via Adaptive Error-Cancellation" IEEE Transactions on Signal Processing, vol. 51, No. 2, Feb. 2003, pp. 575-583.

J.H. Choi et al, "Variation-Aware Low-Power Synthesis Methodology for Fixed-Point FIR Filters" IEEE Transactions on Computer-Aided Design of Integrated Circuits and Systems, vol. 28, No. 1, Jan. 2009, pp. 87-97.

G. Karakontantis et al, "Process-Variation Resilient and Voltage-Scalable DCT Architecture for Robust Low-Power Computing" IEEE Transactions on Very Large Scale Integration (VLSI) Systems, vol. 18, No. 10, Oct. 2010, pp. 1461-1470.

P. Whatmough et al, "A Robust FIR Filter with In Situ Error Detection" IEEE Int. Symp. On Circuits and Systems, May 2010, pp. 4185-4188.

R. Zimmerman, "Binary Adder Architectures for Cell-Based VLSI and their Synthesis" PhD thesis, Swiss Federal Institute of Technology (ETH) Zurich, Hartun-Gorre Verlag, 1998.

Y. Liu et al, "On the Selection of Arithmetic Unit Structure in Voltage Overscaled Soft Digital Signal Processing" Int'l Symp. On Low Power Electronics and Design, Aug. 2007, pp. 250-255.

A.V. Oppenheim et al, "Discrete-Time Signal Processing" Third Edition, 2009, pp. 391-413.

K. Parhi "VLSI Digital Processing Systems: Design and Implementation" 1999, section 4 Retiming.

\* cited by examiner

ERROR MANAGEMENT WITHIN A DATA PROCESSING SYSTEM

BACKGROUND OF THE INVENTION

1. Field of the Invention

This invention relates to the field of data processing systems. More particularly, this invention relates to the management of errors which may arise during the operation of a data processing system.

2. Description of the Prior Art

It is known from WO-A-2004/084072 to provide data processing systems with error management mechanisms that detect and repair errors occurring during operation of the data processing system. With these mechanisms in place it is possible to operate data processing systems closer to their limits, e.g. at lower voltages and higher clock frequencies. More particularly, the data processing systems may be operated using operating parameters that cause errors to occur on an occasional basis with those errors then being detected and repaired. This removes the need for excessive operating margin in the operating parameters. The time and circuit overhead needed to repair errors when they do occur is a disadvantage of this approach.

SUMMARY OF THE INVENTION

Viewed from one aspect the present invention provides an apparatus for processing data comprising:

processing circuitry configured to perform one or more processing operations to generate a result value, said processing circuitry operating under a set of operating parameters, said processing circuitry having:

(i) an error resistant portion configured to have a first probability of an error in operation for said set of operating parameters; and (ii) an error prone portion configured to have a second probability of an error in operation for said set of operating parameters, said first probability being lower than said second probability;

error detection circuitry coupled to said error prone portion of said processing circuitry and configured to detect an error in operation of said error prone portion corresponding to at least one bit of one or more bits of said result value generated by said error prone portion having an incorrect value; and parameter control circuitry coupled to said error detection circuitry and configured to adjust one or more of said set of operating parameters to maintain a non-zero error rate in errors detected by said error detection circuitry; wherein said one or more bits of said result value generated by said error prone portion are such that any error therein is tolerated and said apparatus continues operation without said error prone portion correcting said error.

The present technique recognises that within processing circuitry generating a result value there may be portions of that result value within which it is possible to tolerate an error without a significant adverse effect on the overall performance of the system. As an example, if the result is a numeric value resulting from some form of digital signal processing, such as image processing, wireless signal processing, etc, then the signals being processed will likely include some noise component and accordingly processing errors occurring in bits of low arithmetic significance may be comparable to the noise already present and will generally have little impact upon the overall performance of the system concerned. Having recognised that there is a portion of the processing circuitry within which errors may be tolerated, it is possible to configure this portion such that it is more likely to be prone to errors than a remainder of the processing circuitry. Thus, as the operating parameters of the system are adjusted, errors are most likely to arise within this error prone portion of the processing circuitry. As the portion of the result value generated by this error prone portion is one within which errors may be tolerated, there is no need to correct such errors (and incur the time and circuit overhead penalties in so doing) and yet the occurrence of the errors can be used to indicate that the limit of the operating parameters has been reached. The error prone portion of the processing circuitry is still doing useful work in calculating its portion of the result value in all but the infrequent cases where an error occurs.

It will be appreciated that the result value could have a wide variety of different forms. It is possible that the result value could be a logical value that controls program flow. While it might normally be considered that errors within such a result value controlling program flow could not be tolerated, it is possible that in some circumstances errors may be tolerated within such a result value, e.g. if an error results in a processing loop waiting for an event to be recognised being repeated an extra time, then the event will in any case be recognised upon the next pass through the loop and the failure to recognise the event at its first occurrence may be tolerated.

While there are a wide variety of different forms the result value and the processing circuitry may take, the present technique is well suited to use when the result value is an N-bit result value comprising a plurality of bits of different arithmetic significance, where N is greater than one, and the error resistant portion generates a most significant bit field of the result value having Z bits, where Z is greater than or equal to one. In this circumstance, the present technique recognises that the most significant bits are the ones within which errors cannot be readily tolerated and accordingly these are generated by the error resistant portion.

The error prone portion may generate one or more bits of the N-bit result which are outside of the most significant bit field. Errors within the bits outside the most significant bit field may be more readily tolerated. Whilst the bits outside the most significant bit field which are generated by the error prone portion need not necessarily be the least significant bits within the N-bit result value, it may be convenient in some embodiments that the error prone portion generates a least significant bit field of the result value, the least significant bit field having M bits where M is greater than or equal to one and M+Z is equal to N. Thus, in such embodiments, the N-bit result value is formed as a combination of most significant bit field of Z bits generated by the error resistant portion and a least significant bit field of M bits generated by the error prone portion.

It will be appreciated that the direct representation of an N-bit number by an N-bit result value is only one possibility. More generally the result value may comprise two or more bits and represent a numeric value using a numeric coding scheme.

One example of such a numeric coding scheme is a floating point number coding scheme in which the result value includes an exponent value and a mantissa value (and possibly a sign value). Within such embodiments, an error within the exponent value will typically be difficult to tolerate and accordingly the exponent value is generated by the error resistant portion.

Another example of a coding scheme is where the result value is a unit code. Within such embodiments, it is possible that certain bit errors within the unit code may be tolerated more readily than errors within other bit positions and accordingly a design selection may be made as to which bits of the unit code are generated by the error prone portion and which are generated by the error resistant portion.

In some embodiments, at least one bit of the result value generated by the error prone portion is a redundant bit corresponding to a bit of the result value that is also generated by the error resistant portion. This redundant bit may give a useful indication as to when the limit of the operating parameters has been reached and processing may continue when an error occurs within this redundant bit as the corresponding bit generated by the error resistant portion may be used instead.

The differences in form of the error resistant portion and the error prone portion may vary considerably. In some embodiments the error resistant portion may be formed of transistors that are bigger than equivalent transistors within the error prone portion. Bigger transistors tend to operate more rapidly than smaller transistors and accordingly have a lower priority of generating a timing error. Bigger transistors are also less likely to suffer a soft error (e.g. as a result of a particle strike).

Another example of the difference in the form of the error prone portion and the error resistant portion is a difference in the micro-architecture used within these respective portions. Certain micro-architectures may be faster and accordingly less likely to be subject to timing errors, but may consume more circuit resource in terms of the number of gates or power consumed. Thus, the error resistant portion may use a fast and/or more robust micro-architecture whereas the error prone portion may use a slower and/or less robust micro-architecture.

It will be appreciated that the processing circuitry could have a wide variety of different forms. It could, for example, be a multiplier, a shifter, or some other circuitry performing a logical or arithmetic operation. However, in some embodiments the processing circuitry is adder circuitry. Within this context the first micro-architecture employed in an error resistant portion of the adder may be a parallel-prefix graph micro-architecture with the second micro-architecture utilised in the error prone portion of the adder being a serial-prefix graph micro-architecture.

It will be appreciated that manufacturing variations within the processing circuitry can affect the probability of an error arising in the operation of that processing circuitry. It is desirable that when the limits of the operating parameters are reached, then it should be the error prone portion of the processing circuitry in which an error first arises. Accordingly, in some embodiments the processing circuitry is configured such that manufacturing variations in the processing circuitry result in a maximum change in a probability of an error in operation for the set of operating parameters in use that is less than a difference between the first probability and the second probability. In this way, even if manufacturing variation does alter the probability of errors in the two portions, then this will not result in the error resistant portion failing before the error prone portion fails.

The operating parameters which are controlled by the parameter control circuitry can have a wide variety of different forms. However, in some embodiments these operating parameters include at least one of a voltage of a power supply to the processing circuitry and an operating frequency of a clock signal controlling operation of the processing circuitry. Such parameters are usefully used within DVFS (dynamic voltage frequency scaling) systems.

While not a requirement for use of the present technique, the technique is more likely to be useable within systems in which the one or more processing operations are performed upon at least one input operand having a noise component. Given that the input operand has a noise component, it is likely that low magnitude differences in the result value can be tolerated (or corrected by subsequent error correcting mechanisms or algorithms) and accordingly the present techniques may be used whereby the error prone portion effectively adds an additional noise component as a result of its errors in operation to the noise components which are already present within the result value.

While not restricted to these fields of use, the present technique has applicability within image data processing, audio data processing, graphics data processing and wireless signal processing. Such environments typically have a tolerance to errors such that errors in the operation of the error prone portion of the processing circuitry need not be corrected and yet may be used to indicate when the limit of the operating parameters of the processing circuitry have been reached.

In some embodiments the error prone portion may be rendered more likely to generate a timing error by the inclusion within it of one or more buffer circuits configured to delay a generation of the one or more bits of the result value generated by the error prone portion. This makes it more likely that the error prone portion will generate an error before the error resistant portion which does not include corresponding buffer circuits.

Another way in which the processing circuitry may be configured to provide an error resistant portion and an error prone portion is when the processing circuitry comprises a plurality of processing stages and the error resistant portion is permitted to extend over a greater number of the processing stages than the error prone portion. This gives more timing slack to the error resistant portion and accordingly renders it less likely to be subject to a timing error.

Viewed from another aspect the present invention provides an apparatus for processing data comprising:

processing means for performing one or more processing operations to generate a result value, said processing means operating under a set of operating parameters, said processing means having:
  (i) an error resistant portion configured to have a first probability of an error in operation for said set of operating parameters; and
  (ii) an error prone portion configured to have a second probability of an error in operation for said set of operating parameters, said first probability being lower than said second probability;

error detection means coupled to said error prone portion of said processing means for detecting an error in operation of said error prone portion corresponding to at least one bit of one or more bits of said result value generated by said error prone portion having an incorrect value; and parameter control means coupled to said error detection circuitry for adjusting one or more of said set of operating parameters to maintain a non-zero error rate in errors detected by said error detection means; wherein said one or more bits of said result value generated by said error prone portion are such that any error therein is tolerated and said apparatus continues operation without said error prone portion correcting said error.

Viewed from a further aspect the present invention provides a method of processing data comprising the steps of:

performing one or more processing operations to generate a result value using processing circuitry, said processing circuitry operating under a set of operating parameters;

operating an error resistant portion of said processing circuitry with a first probability of an error in operation for said set of operating parameters;

operating an error prone portion of said processing circuitry with a second probability of an error in operation for said set of operating parameters, said first probability being lower than said second probability;

detecting an error in operation of said error prone portion corresponding to at least one bit of one or more bits of said result value generated by said error prone portion having an incorrect value; and adjusting one or more of said set of operating parameters to maintain a non-zero error rate in errors detected; wherein said one or more bits of said result value generated by said error prone portion are such that any error therein is tolerated and said method continues operation without said error prone portion correcting said error.

The above, and other objects, features and advantages of this invention will be apparent from the following detailed description of illustrative embodiments which is to be read in connection with the accompanying drawings.

DESCRIPTION OF THE EMBODIMENTS

Figure 1:
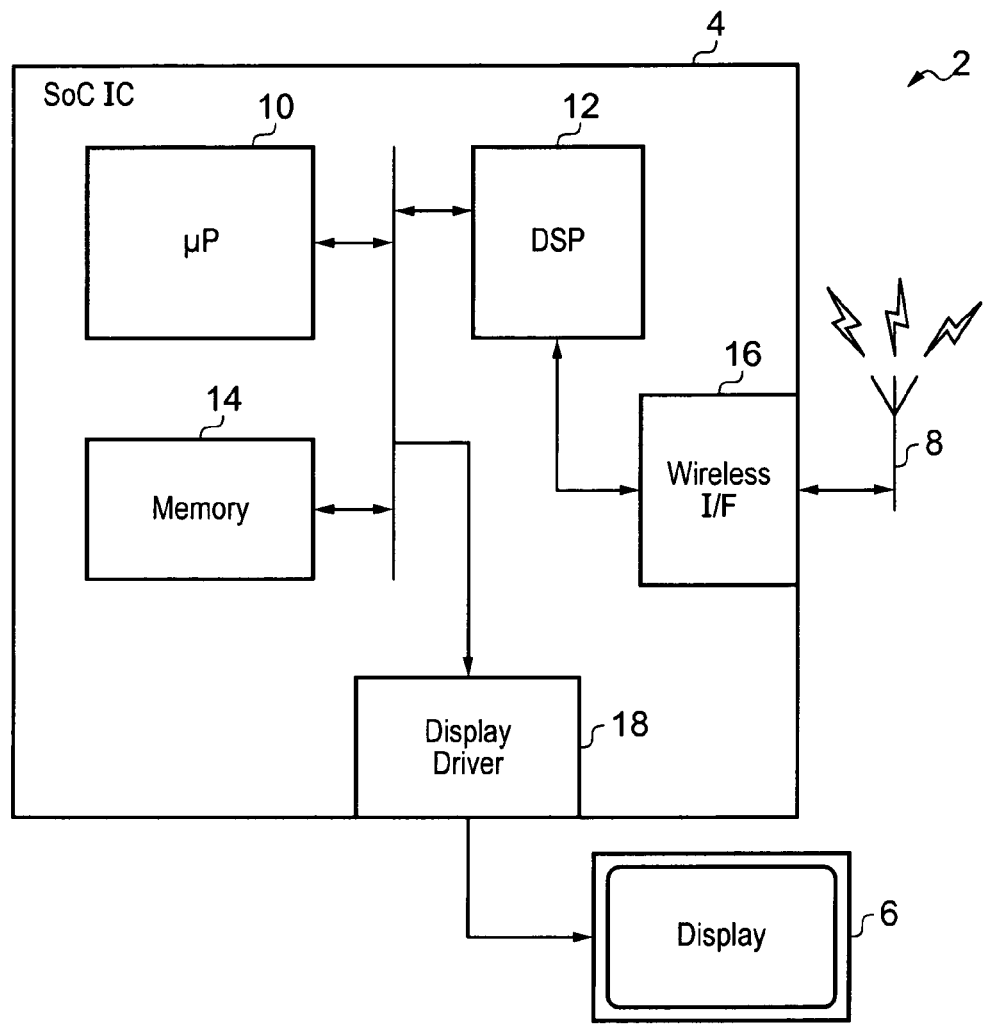
FIG. 1 schematically illustrates a data processing system.

FIG. 1 schematically illustrates a data processing system 2 including a system-on-chip integrated circuit 4 coupled to a display 6 and an antenna 8. Within the integrated circuit 4 are a processor core 10, a DSP unit 12, a memory 14, a wireless interface 16 and a display driver 18. The microprocessor core 10 executes program instructions read from the memory 14 to manipulate data values and to form image and graphics data for display on the display 6 via the display driver 18. The DSP unit 12 receives wireless signals via the antenna 8 and the wireless interface 16. The DSP unit 12 processes these wireless data signals to extract audio or other data signals therefrom. It will be appreciated by those in this technical field that the data processing system 2 of FIG. 1 may typically contain many further elements. These elements have been omitted from FIG. 1 for the sake of simplicity.

The data processing system 2 of FIG. 1 is capable of performing data processing operations that manipulate wireless data, image data, graphics data and audio data. These forms of data manipulation have the characteristic that they may contain noise (errors) without significantly affecting the operation of the data processing system 2. As an example, if an image being generated contains some pixel values that are in error, then these pixel values may appear to be slightly the wrong brightness or colour and this will degrade the image quality, but will not prevent the data processing system 2 from continuing further operation. In a similar way, audio data may contain undesirable noise as a result of processing errors, but the speech or music being reproduced by that audio data may still be intelligible to the user. The wireless signals received by the antenna 8 will typically already include a noise component and the processing of those wireless signals to extract a data signal will include algorithms which are resistant to such noise. If an error in the processing of that wireless data signal occurs, then this will add to the noise within the signal and the processing algorithms and/or the data processing system 2 may continue their normal operation without undue disturbance.

The errors/noise within the result values produced by the data processing system 2 of FIG. 1 are typically acceptable when they occur within a particular portion of a result value being calculated. As an example, if the result value is a numeric value, then errors within the bits of lower significance may generally be better tolerated than within the more significant bits.

The data paths within the DSP unit 12 and the microprocessor 10 (as well as potentially other data paths within the data processing system 2) may be arranged such that they include an error prone portion which generates the least significant bits of the result value and an error resistant portion which generates the most significant bits of the result value. This will be described further below.

Figure 2:
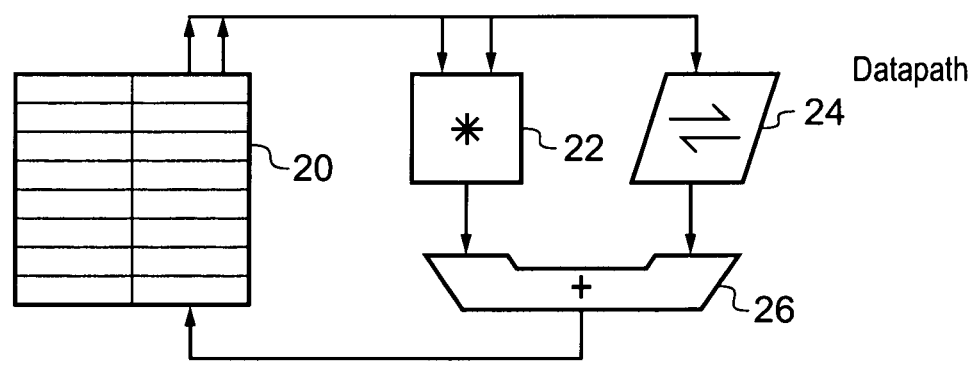
FIG. 2 schematically illustrates a data path within a data processing system.

FIG. 2 schematically illustrates an example data path. This data path includes a register bank 20, a multiplier 22, a shifter 24 and an adder 26. It may be possible, for example, to configure the adder 26 such that it has an error resistant portion for calculating the bits within a most significant field of the result value and an error prone portion for calculating the bits of a least significant bit field within the result value. Input operands are read from the register file 20 and pass through the data path 22, 24, 26 before a result value is written back to the register file 20. The multiplier 22 and the shifter 24 may also be provided with respective error resistant portions and error prone portions.

Figure 3:
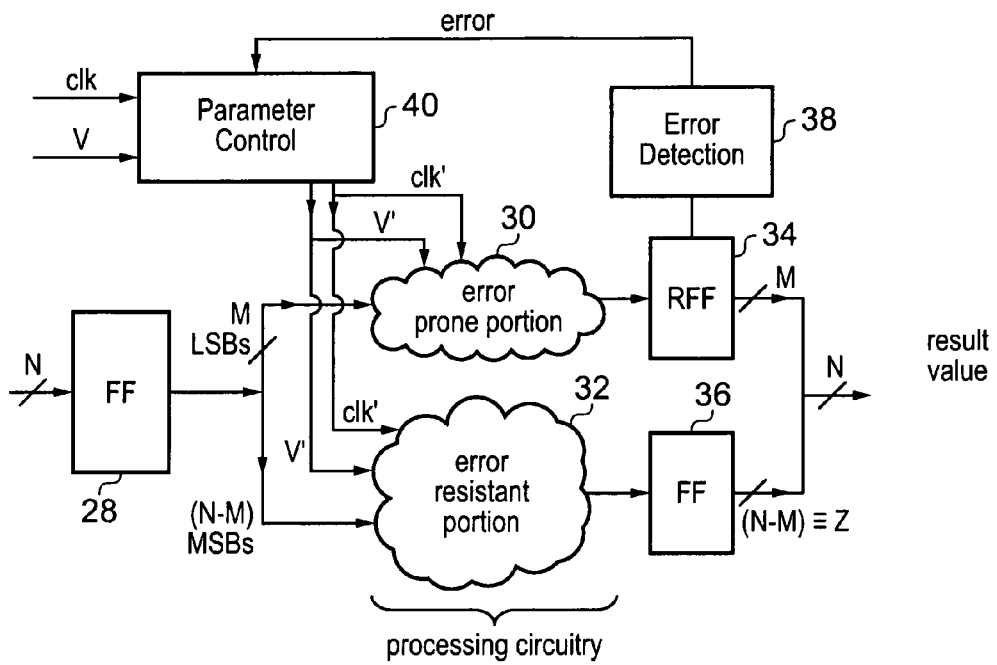
FIG. 3 schematically illustrates a data path including an error prone portion and an error resistant portion.

FIG. 3 schematically illustrates a portion of a data path between a bank of flip flops (storage elements) 28 storing an N-bit input operand value which is to be subject to processing by processing circuitry formed of an error prone portion 30 and an error resistant portion 32. The error prone portion 30 generates the M bits of the result value that are the least significant portion of the result value. The error resistant portion 32 generates (N−M) bits of the result value that are the most significant portion of the result value. The M-bits of result value are captured within flip flops 34 while the (N−M) bits of result value are captured within flip flops 36. The outputs from the flip flops 34 and the flip flops 36 are combined to produce a N-bit result value.

Error detection circuitry 38 is coupled to the flip flops 34 which receive the portion of the result value generated by the error prone portion 30 of the processing circuitry. The error detection circuitry 38 detects if any of the bits of this part of the result value have an error. Such an error may be a timing error detected by the occurrence of a late edge in a signal to be captured by the flip flops 34. Other forms of error detection are also possible. As an example, a transition within the value of a bit stored within one of the flip flops 34 occurring within a speculation window of the clock period may be used to identify an error in a bit value which has previously been captured and forwarded for use as part of the N-bit result value.

If the error detection circuitry 38 detects an error, then this is signalled to parameter control circuitry 40. The parameter control circuitry 40 monitors the rate of occurrence of errors and maintains this at a desired target rate. This target rate is a non-zero value as this ensures that the processing circuitry is operating close to its limiting conditions. The parameter control circuitry 40 generates a clock signal clk' and a supply voltage V' which is supplied to both the error prone portion 30 and the error resistant portion 32. The clock signal has an operating frequency and serves to control the processing performed by the error prone portion 30 and the error resistant portion 32 in a manner familiar to those in this technical field. The power supply signal with voltage V' supplied to the error prone portion 30 and the error resistant portion 32 has a voltage held at a value just sufficient to support the desired processing to be performed whilst resulting in a finite error rate within the error prone portion 30.

The error prone portion 30 is designed to have a higher probability of an error occurring at a given set of operating parameters than the error resistant portion 32. Thus, if the error resistant portion 32 has a first probability of an error in operation for a given set of operating parameters (clk', V') and the error prone portion has a second probability of an error occurring for that same set of operating parameters, then the first probability will be lower than the second probability. The difference between these two probabilities may be designed to be greater than the maximum change in the probabilities that is expected to occur due to manufacturing variation within the integrated circuit 4.

It will be seen that the error prone portion 30 is coupled to the error detection circuitry 38 and that the design of the processing circuitry of FIG. 3 is such that if an error occurs then it should occur within the error prone portion 30. The operating parameters of both the error prone portion 30 and the error resistant portion 32 are adjusted by the parameter control circuitry 40 in dependence upon the rate of errors detected within the error prone portion 30. This permits the error resistant portion 32 to operate close to its limiting conditions without the error resistant portion 32 actually being subject to any errors or having to include error detection circuitry. Furthermore, since errors which occur within the error prone portion result in errors within bits of the result value within which errors can be tolerated, there is no need to correct these errors and accordingly replay of the processing operations or correction of the processing operations is not required.

The differences between the error prone portion 30 and the error resistant portion 32 can have a variety of forms. In one example the error resistant portion 32 may be formed of physically bigger transistors than the error prone portion 30. Physically bigger transistors are typically less prone to soft errors and are faster than smaller transistors. The result of this is that if timing errors or soft errors are to occur due to the frequency or voltage being used or the level of background radiation, then these will occur within the error prone portion 30 before they arise within the error resistant portion 32. It is also possible to vary the way in which the error prone portion 30 and the error resistant portion 32 are formed relative to each other in other ways, such as micro-architecture, as will be described further below.

Figure 4:
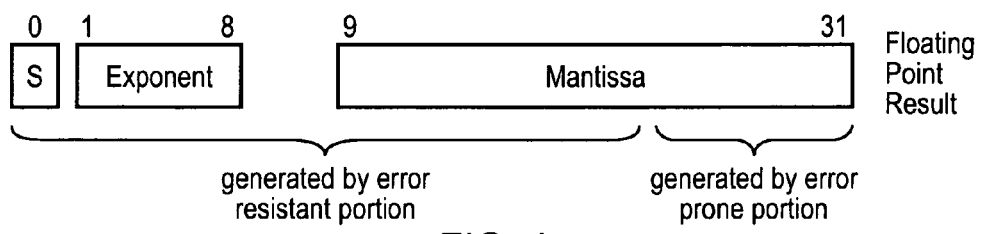
FIG. 4 schematically illustrates a floating point result value.

In the previous example the result value was a simple binary number. Within such a simple binary number errors may often be better tolerated within the bits of lower significance. It is also possible that the present technique may be used with other forms of result value. FIG. 4 schematically illustrates a floating point value. In this form of result value, errors can generally be tolerated within the lower order portion of the mantissa and are less well tolerated within the higher order portion of the mantissa, the exponent value or the sign value. Thus, the error resistant portion of the processing circuitry generating a floating point result value will calculate the sign value, the exponent value, and the higher order portion of the mantissa. The lower order portion of the mantissa may be generated by the error prone portion. Floating point values are often used to represent signals such as image signals, audio signals, wireless signals and graphics values to be manipulated. Noise components may be inherent within such signals that are being processed (e.g. if they are representing real world captured signals) or may be tolerated in other circumstances (e.g. if a graphics image is being generated then an amount of noise within a graphics image may be acceptable).

Figure 5:
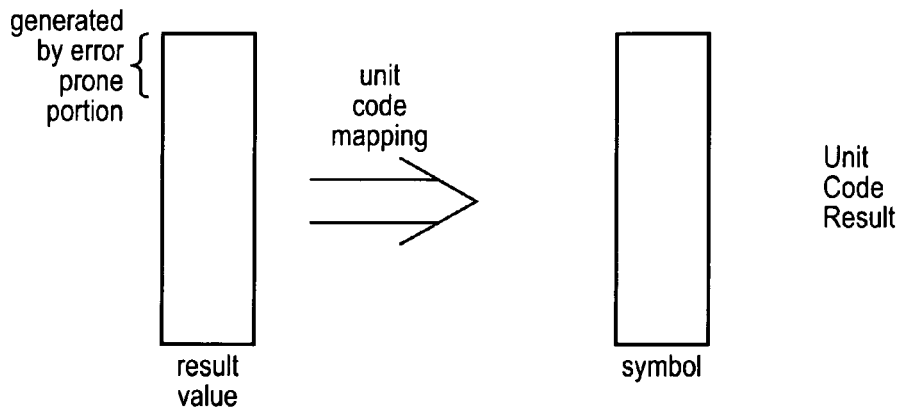
FIG. 5 schematically illustrates a unit code result value.

FIG. 5 schematically illustrates another form of result value. In this example the result value is a unit code in which a unit code mapping relates a given result value to a symbol to be processed further. Depending upon the unit code mapping employed, it is possible that one or more bits within the result value may be associated with a higher degree of tolerance to error than the remainder of the result value. For example, an error within some specific bits may result in similar symbols being mapped and may be tolerated. In this case, these bit values corresponding to a tolerable error may be generated by the error prone portion and the error prone portion may be operated with a finite error rate in order to generate the data necessary for the parameter control circuitry 40 to control the operating parameters for both the error prone portion 30 and the error resistant portion 32.

Figure 6:
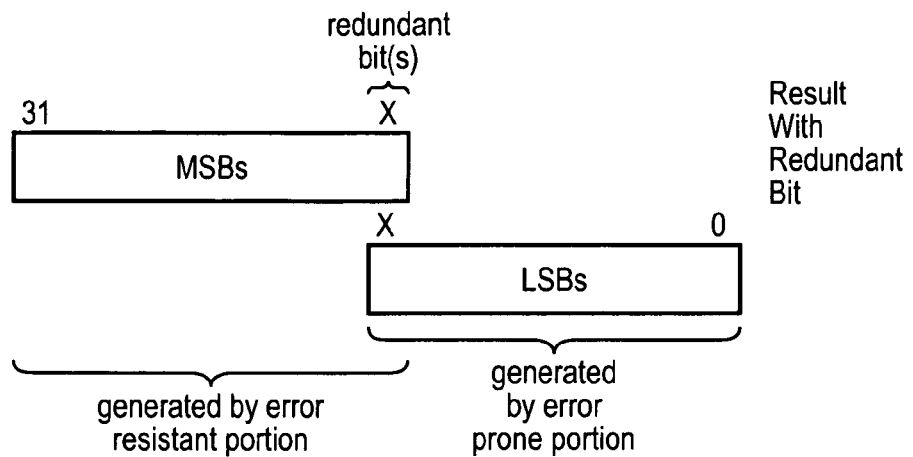
FIG. 6 schematically illustrates a result value with a redundant bit.

FIG. 6 is an example showing a result value with a redundant bit. This example is a 32-bit binary number. The least significant bit portion extends from bit 0 to bit X. The most significant bit portion extends from bit X to bit 31. It will be seen that bit X is part of both the least significant bit field which is generated by the error prone portion 30 and the most significant bit field which is generated by the error resistant portion 32. Thus, the bit value at position X within the least significant bit field is redundant and accordingly a bit error within this bit value may be tolerated without disturbing processing since the correct value for this bit position may be read from the most significant bit field which is generated by the error resistant portion 32.

Figure 7:
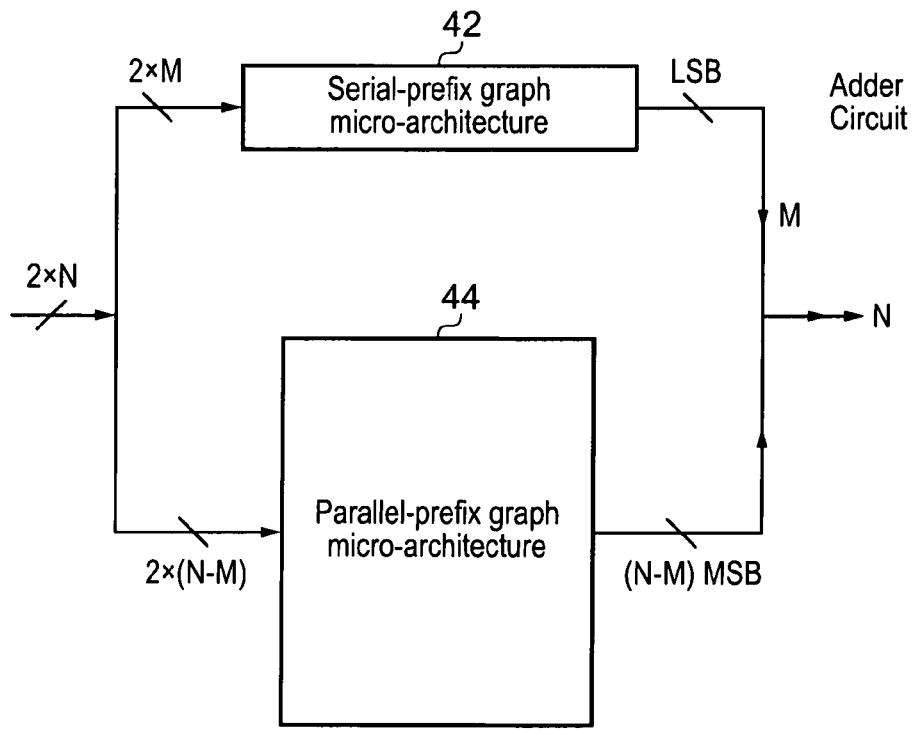
FIG. 7 schematically illustrates an adder circuit using different micro-architectures for calculating a least significant bit field and a most significant bit field.

FIG. 7 schematically illustrates an example portion of a data path being an adder circuit, such as the adder 26 of FIG. 2. This adder circuit receives as input operands two N-bit binary values. The lower order M-bits of the result are calculated using a serial-prefix graph micro-architecture adder 42. The most significant (N–M) bits of the result are calculated using a parallel-prefix graph micro-architecture adder 44. It will be appreciated that the parallel-prefix graph micro-architecture adder 44 will operate faster and be less timing error prone than the serial-prefix graph micro-architecture adder 42. However, the serial-prefix graph micro-architecture adder 42 will typically consume less circuit resource as it will be simpler and utilise fewer transistors. In this example, it is the micro-architecture which differs between the error prone portion 42 and the error resistant portion 44 of the processing circuitry forming the adder.

Figure 8:
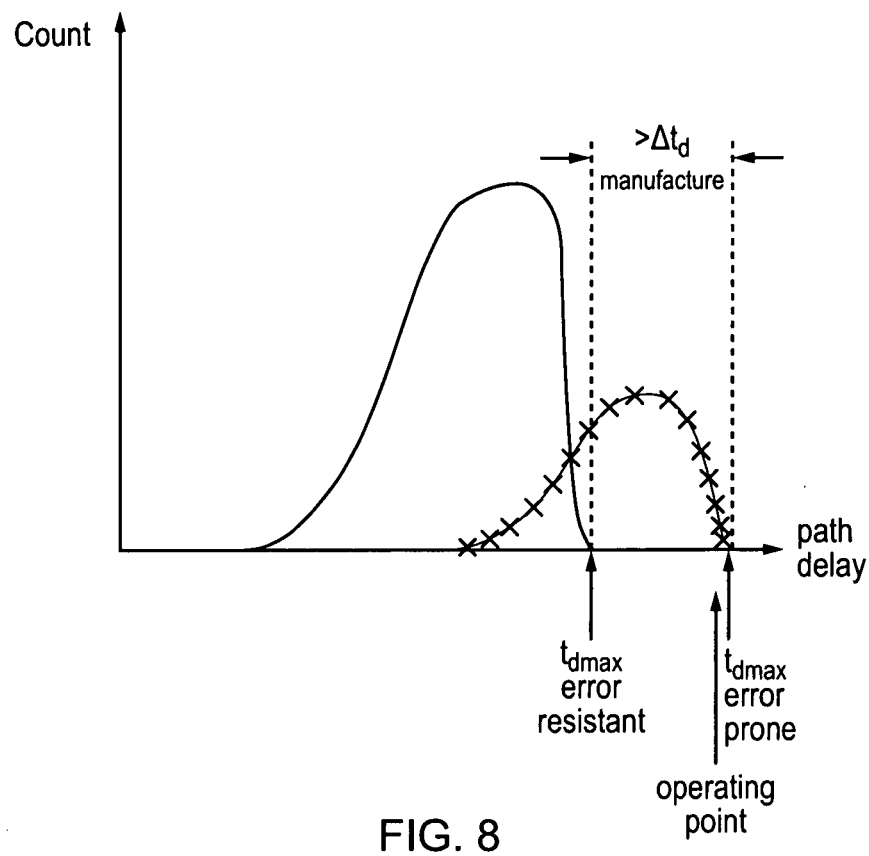
FIG. 8 schematically illustrates the timing delay through a data path measured over multiple instances of the circuit in respect of an error resistant portion of the data path and an error prone portion of the data path.

FIG. 8 is a diagram illustrating the distribution of timing delays through the error resistant portion (solid line) and the error prone portion (line of crosses) which together form processing circuitry for generating different bits within a result value. This distribution in the delay is determined over a population of different instances of the processing circuitry concerned. As will be seen from FIG. 8, the maximum delay time of the error resistant portion is lower than the maximum delay time of the error prone portion. Thus, as operating voltage is decreased and/or operating frequency increased, then timing errors should occur within the error prone portion 30 before they arise within the error resistant portion 32. The operating point at which the voltage and/or frequency are held is such that a non-zero error rate occurs within the error prone portion 30. The difference between the maximum path delay of the error resistant portion 32 and the maximum path delay of the error prone portion 30 is controlled by the design and manufacture of these respective portions such that it exceeds the expected maximum variation in the path delay likely to arise due to manufacturing variation. This aims to avoid manufacturing variation leading to the error resistant portion 32 incurring an error due to a low voltage or a high frequency before the corresponding error prone portion 30 suffers an error.

Figure 9:
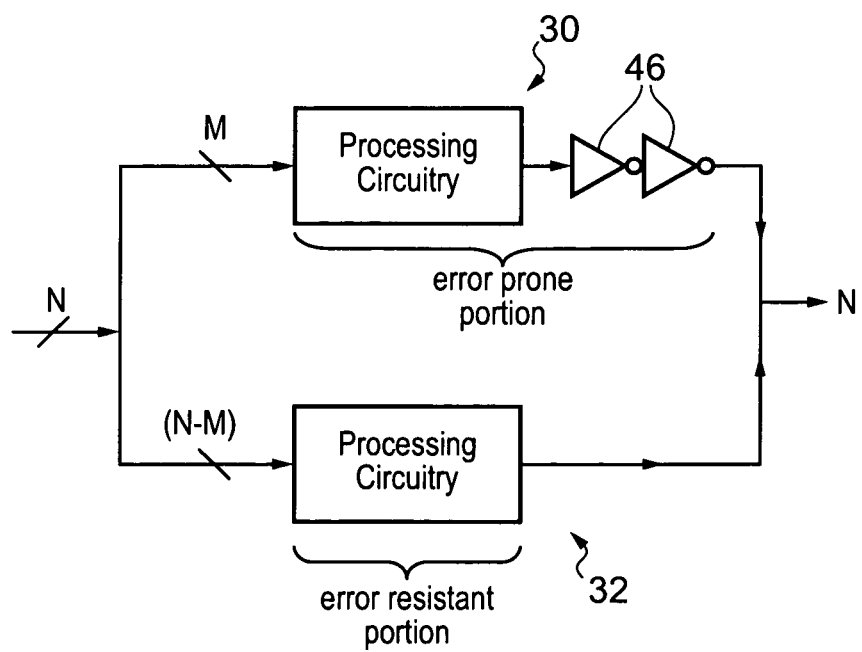
FIG. 9 illustrates how an error prone portion of a data path may be designed to be error prone.

FIG. 9 illustrates another way in which processing circuitry may be divided into an error prone portion 30 and an error resistant portion 32. In this example the processing circuitry within the error prone portion 30 and the error resistant portion 32 may be the same (e.g. formed with transistors of the same size, using the same micro-architecture and otherwise having a common design), but in the case of the error prone portion 30, buffer circuits 46 have been added to the signal path for the bits of the result value which are calculated by the error prone portion 30. Thus, the error prone portion 30 should be subject to timing errors before the error resistant portion 32.

Figure 10:
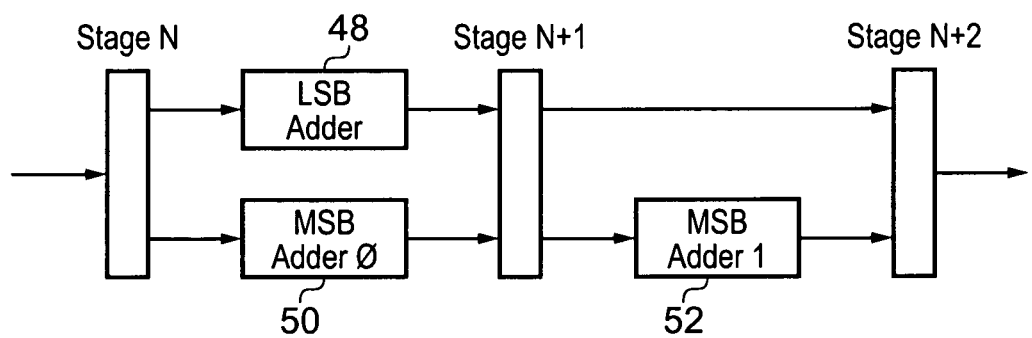
FIG. 10 schematically illustrates how an error resistant portion of a data path may be designed to be error-resistant.

FIG. 10 illustrates another example embodiment in which the form of the error resistant portion and the error prone portion differ. In this example, the processing circuitry is distributed over a plurality of processing stages. The error prone portion 48 calculates the least significant bits of an addition and is located within a single stage. The error resistant portion 50, 52 calculates the most significant bits of an addition and is spread over two adjacent processing stages. In this way, the error resistant portion 50, 52 has two clock cycles to complete its processing whereas the error prone portion 48 only has a single clock cycle. This has the consequence that greater timing slack may be provided for the error resistant portion 50, 52 than is provided for the error prone portion 48. Thus, a timing error if it arises will arise within the error prone portion 48.

Figure 11:
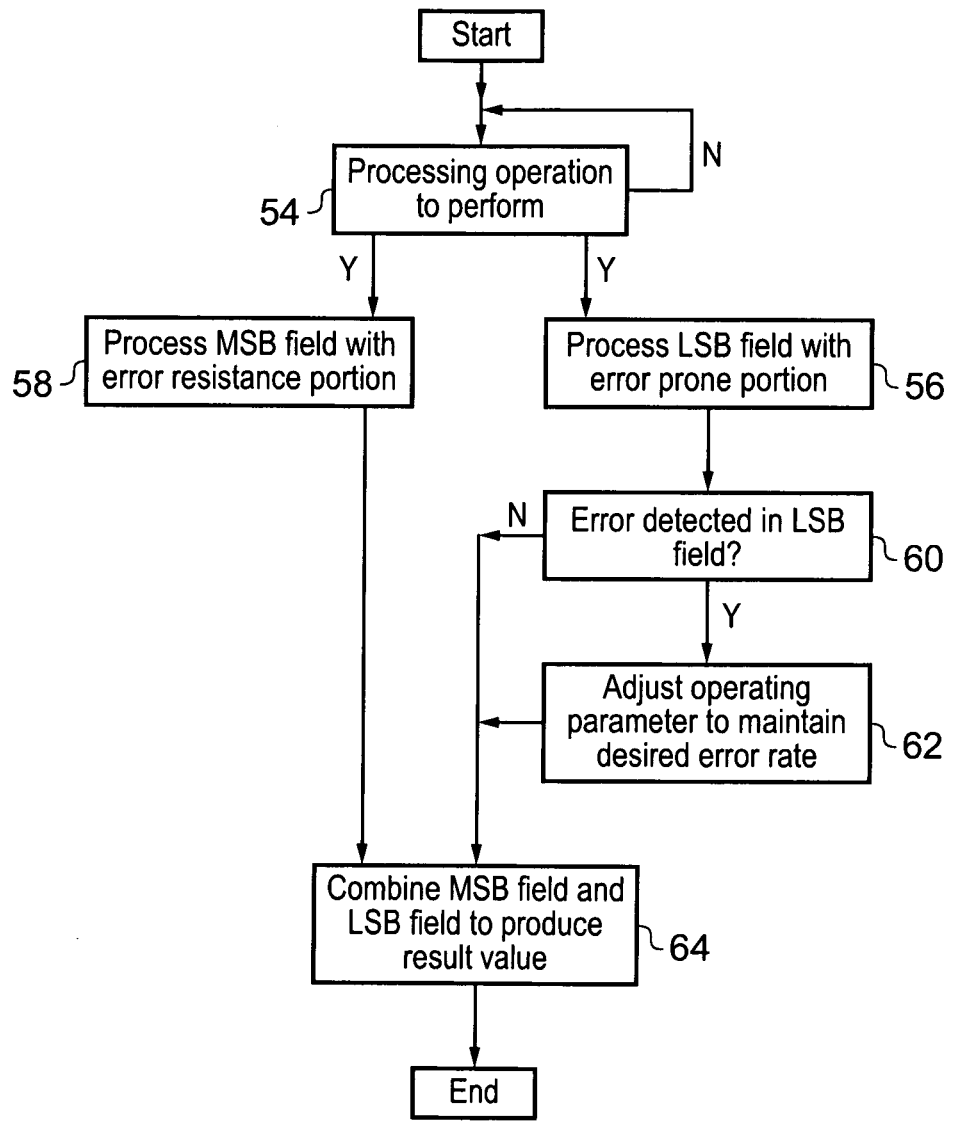
FIG. 11 is a flow diagram schematically illustrating the operation of the circuit of FIG. 3.

FIG. 11 is a flow diagram schematically illustrating the processing performed by the circuitry of FIG. 3. At step 54 processing waits until there is a processing operation to be performed. When a processing operation is received, then parallel processing is invoked both within the error prone portion 30 and the error resistant portion 32 to calculate their respective parts of the result value. Thus, at step 56 the error prone portion calculates the least significant bit field of the result value. At the same time, the error resistant portion calculates the most significant bit field of the result value at step 58.

Step 60 serves to detect if there are any bit errors within the portion of the result value generated by the error prone portion. If there are errors detected, then step 62 serves to adjust the operating parameters of the error prone portion and the error resistant portion in order to maintain the desired error rate. At step 64 the most significant bit field and the least significant bit field are combined to produce the result value.

It will be noted that even if an error is detected in step 68, then as this error is occurring within the least significant bit field where bit errors may be tolerated, there is no need to correct this error within the processing circuitry itself and the result value will include this error within the relevant bit of low significance.

Figure 12:
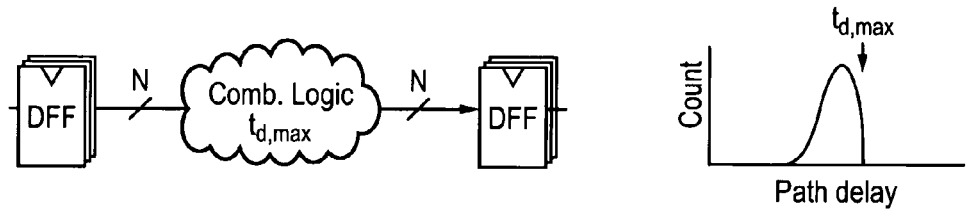
FIG. 12 schematically illustrates conventional N-bit combinational arithmetic datapath logic stage and corresponding diagrammatical representation of a typical balanced path delay histogram.
Figure 13:
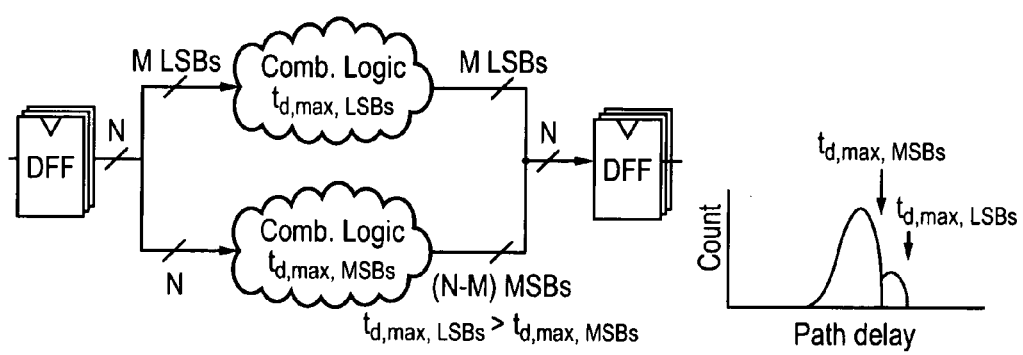
FIG. 13 schematically illustrates a modified N-bit combinational arithmetic datapath logic stage and corresponding diagrammatical representation of the path delay profile.

The present techniques may be used, for example, to improve a digital electronic system. The techniques may involve separation of the endpoints of an N-bit combinational logic data-path (see FIG. 12) of non-uniformly weighted number representation typically unsigned or signed ("sign-magnitude" or "two's complement") binary representation but more generally, any number system where there is a monotonically increasing weight assignment with bit order) into two groups, one group of M LSBs∈{$x_0, x_1, \ldots, x_{M-1}$}, which are considered prone to intermittent logical errors by design, and the remaining group of (N−M) MSBs∈{$x_M, \ldots, x_{N-1}$}, which are considered error-free by design (see FIG. 13).

The relative probability of timing errors occurring in each of the two groups, under adverse conditions (i.e. process, voltage, temperature variation), is effected by means of controlling relative path delays such that the longest path delay (the longest path delay may be from a static analysis or may incorporate expected path sensitisation rates) of the LSB group ($t_{d,max,LSBs}$) is always greater than that of the MSB group ($t_{d,max,MSBs}$), by a given delay margin, $t_{d,margin} = t_{d,max,LSBs} - t_{d,max,MSBs}$, which represents the worst expected delay variation. Although the LSB group is engineered to fail first, these end-points are not redundant; they provide a useful function, but their intermittent failure does not cause an unacceptable reduction in system performance, according to some quantitative performance requirement, since their failure only results in a small arithmetic error relative to failure of the MSB group, since $2^M \ll 2^N$ (c.f. M<N).

The separation of combinational logic end-points may be only for a small section(s) of the whole path or it may encompass the entire logic stage. In some examples, only the final stage vector merge carry-propagate adder would need to be separated. In order to mitigate the effects of local variability, it is advantageous to increase logic shared by long paths to both groups of end-points. In-situ error detection techniques may be used at the critical end-points to detect late arriving transitions, which are assumed to be the manifestation of timing errors and subsequently tune the supply voltage and/or clock frequency to the desired operating point at which a non-zero error rate arises.

Figure 14:
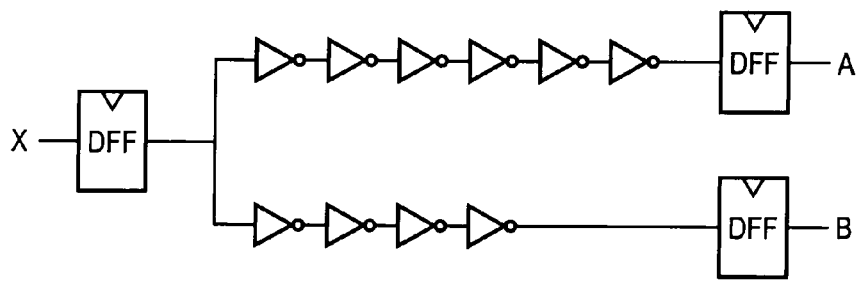
FIG. 14 schematically illustrates manipulating timing error probabilities by shaping path delays.

The example embodiments illustrate how a carry-propagate adder can be constructed with enhanced robustness to timing errors. A carry-propagate adder is significant since it is typically the final logic stage (vector merge adder) in high performance arithmetic circuits, which otherwise use fast redundant (e.g. carry-save) number representations for the majority of the arithmetic. Carry propagation is also necessary for a number of other arithmetic operations, such as subtraction and magnitude comparison. The present technique manipulates the timing error probabilities for different end-points by shaping the maximum path delay and therefore the end-point timing "slack". This is illustrated in FIG. 14, where the two paths X→A and X→B will nominally experience different probabilities of timing errors under adverse conditions since the path X→A is longer by two inverter delays. This observation ignores variability effects, which will be discussed below.

The first step is to partition the carry-propagate adder into two groups of end-points, one group of M LSBs and one group of (N−M) MSBs. The second step is to manipulate the adder topology to manoeuvre the critical path delays, ensuring the MSB group end-points have greater timing slack relative to the LSB group. There are at least two ways to affect the relative delay of the logic cones described below. The first is by using different logical construction and the second is by circuit techniques such as device (cell) sizing or artificial net loading. Here we will examine the former, which may have advantages since logical topologies can be developed that maximise signal dependencies and are therefore less affected by local variability.

The logic for the M-LSB group is implemented with a serial-prefix (ripple-carry), while the (N−M)-MSB logic is implemented with a minimum-depth parallel-prefix tree (in this example a tree after Sklansky is used, ignoring the effect of variable fan-out on delay).

The serial-prefix structure has a chain-like construction that evaluates in O(M) time, whereas parallel-prefix structure has a tree composition that achieves a carry path of O($\log_2$(N)) time. Therefore, if M and N are chosen such that M>$\log_2$(N), the critical path of the whole structure is in the LSB group and hence under adverse conditions, errors will manifest in the LSBs before the MSBs. The serial and parallel prefix topologies can be constructed within a single graph (see FIG. 15), with the conventional pre-processing (□), prefix (○) and post-processing (◇) operators of known logical construction. Thus both the serial and parallel prefix networks can be constructed from identical logic cells, which also helps to mitigate the effects of local variability which otherwise jeopardises this current approach.

Figure 15:
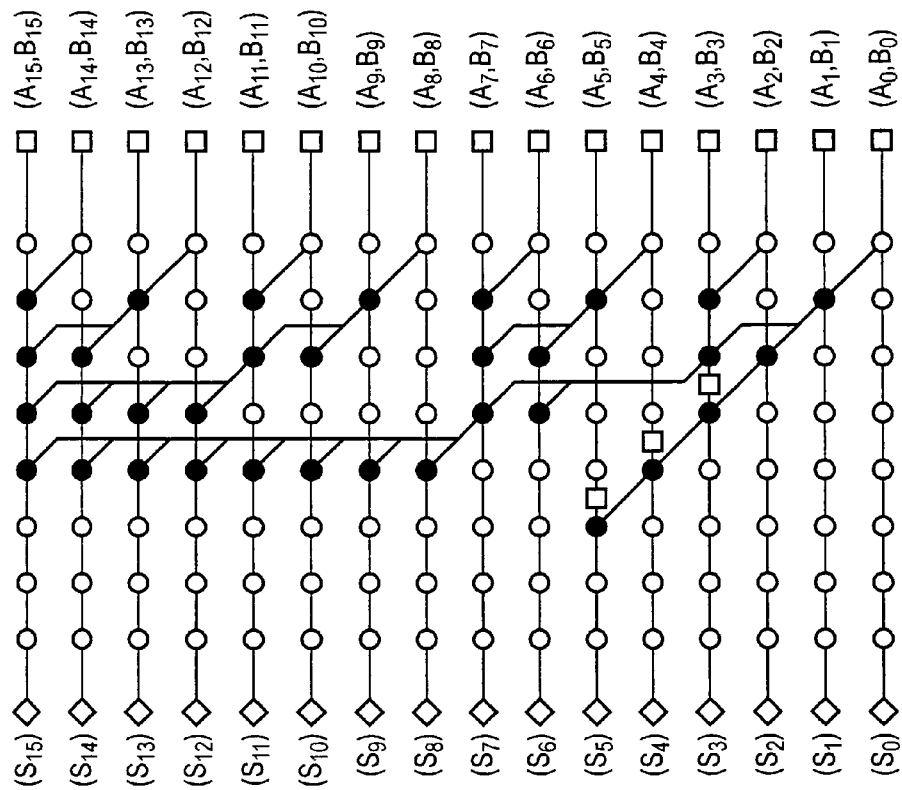
FIG. 15 schematically illustrates a binary addition prefix graph with critical paths to sum end-point $S_5$ greater than long paths to all other end-points by 1 dot-operator, where ⅕ of the dot-operators (20%) on the critical path to $S_5$ are shared by other end-points and additional square operators in the same column represent a new edge from $P_iG_i$.

From FIG. 15, we can clearly see that end-point $S_5$ has a critical path which includes five dot-operators and all other end-points have paths containing no more than four dot-operators. If a timing error at register $S_5$ results in a logic flip, the arithmetic weight of the resulting noise contribution is $2^5=32$ which is considered negligible relative to an MSB flip (register $S_{15}$) which would have an arithmetic weight of $2^{14}=16,384$. In this case the margin between failure of registers $S_5$ and $S_{15}$ is equal to the delay of one dot-operator.

Figure 16:
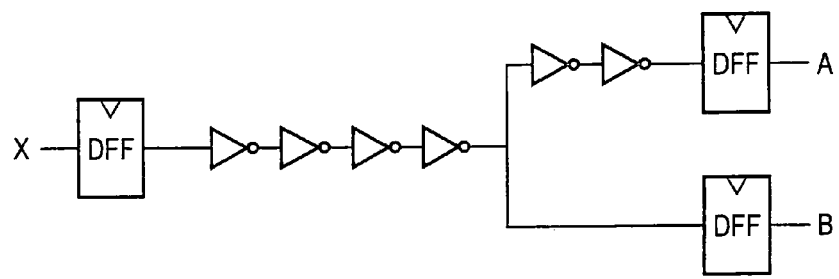
FIG. 16 schematically illustrates the sharing of logic to reduce the effect of variability to only the logic following the point of divergence of paths X→A and X→B.

In practical implementation of the topology of FIG. 15, variability is a concern. In particular, severe local-variability effects might result in the delay to register $S_{15}$ begin greater than the delay to register $S_5$. Variability effects cannot, however, affect edges of the graph that are on critical paths to both end points. In other words, the greater the number of nodes on critical paths to both end-point groups, the less variability is a concern, since the delay experienced is identical due to logical dependency up to the point of divergence. An example is given in FIG. 16, where we have the hypothetical example of two paths with different delays to end-points A and B implemented to affect the relative probability of timing errors. The bottom version would typically experience less variation in the relative delays since four of the inverters are shared between both paths and therefore cannot contribute to variation in the relative delay.

Figures 17, 18:
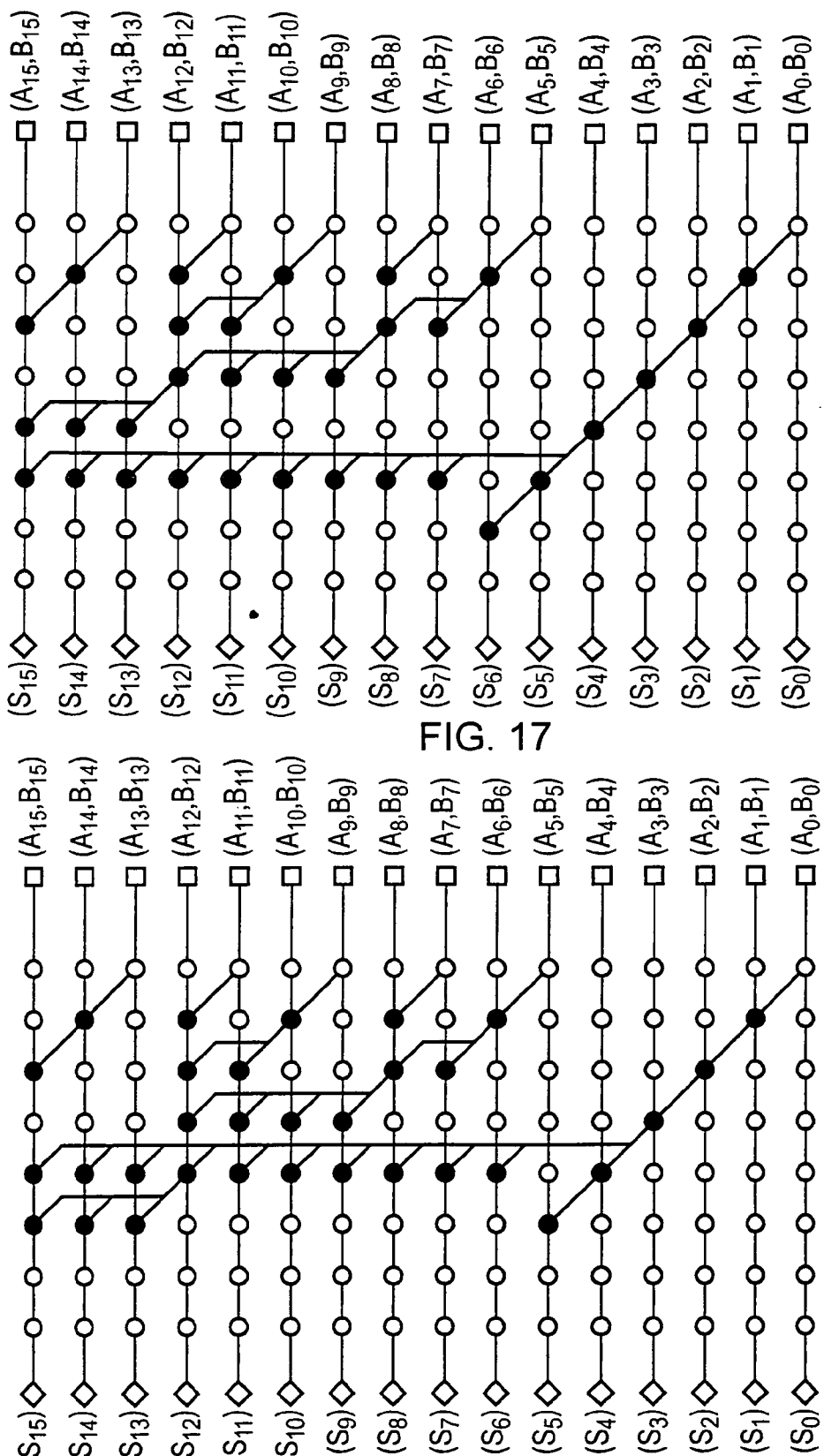
FIG. 17 shows an alternative graph where $S_6$ is the critical path in the LSB group.
FIG. 18 schematically illustrates binary addition prefix graph with critical paths to sum end-points $S_5$ and $S_{16}$.

FIG. 17 shows an alternative graph where $S_6$ is the critical path in the LSB group. Here a timing error resulting in a logic flip generates a noise contribution of $2^6=64$. This graph has the advantage of sharing ⅔ dot-operators (67% of the logic) between the slowest paths to each end-point group and therefore maximises the logical dependency between long paths to different end points.

Another degree of freedom exists when there are known path activation probabilities. For many applications, the probability of activating the full-width carry chain is very small for a pair of N-bit uniformly-distributed random unsigned operands, the average length of the longest complete carry chain during addition tends to $\log_2$(N). This result does not hold for signed operands due to sign-extension which typically causes regular activation of long carry chains when the sign bit flips, in which case it may be possible to make the longest path to the LSB endpoints equal to the longest path to the MSB end-points and then rely on a very low activation probability of the longest MSB path. FIG. 18 illustrates an example graph that has equal number of dot-operators on the longest paths to each end point group.

Since it is possible to synthesize pareto-optimal graphs for arbitrary constraints (in this case the specific number of dot operators may be constrained on the longest paths to certain end-points) there are many possible alternative solutions to the presented examples. In the above examples, it is assumed that in implementation, cells are sized, placed and routed such that near identical rise-times are maintained at the outputs of each dot-operator, irrespective of the wire-load due to fan-in and fan-out. It is also assumed equal signal arrival times are present.

Figure 19:
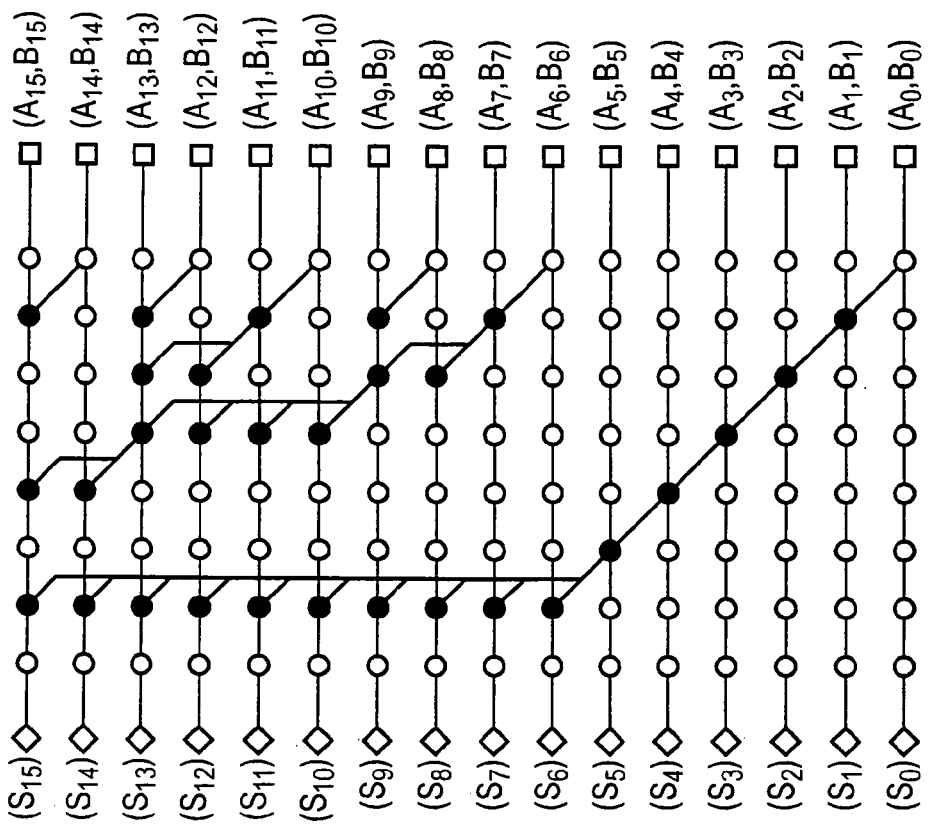
FIG. 19 schematically illustrates a binary addition prefix graph with late arriving intermediate carry from the LSB to MSB groups allowing graceful degradation under sub-critical operation.

An alternative implementation is to provide the intermediate carry between LSB and MSB groups so that it is the latest arriving signal on the critical path to each MSB group end-point, as illustrated in FIG. 19. Hence under sub-critical operation, a late arriving intermediate carry will not reach the MSB group before the clock edge and therefore the MSB sum bits will behave as if the input operands were truncated prior to the addition. This approach relies on the MSB sum bits being stable for a period before the late arriving intermediate carry signal is broadcast.

The drawback compared to the previous approach is that there is considerable risk of metastability at the MSB end-points since they are critical due to the late arriving intermediate carry. Also, there are no shared signals in the LSB and MSB paths before the intermediate carry broadcast, so local variability is more of a concern.

Timing errors typically result in incorrect evaluation of the logic closest to the end-point, since these gates have not had sufficient time to reach a quiescent state before being sampled by the flip-flop. Retiming is a term that refers to the moving of gates across a register boundary and therefore is also effective in moving the location of timing errors. The technique can be used to introduce slack at one group of end-points relative to another, by moving some of the gates into the next stage of logic. A simple example of this is to separate the carry-propagate adder into two sections, an M-LSB adder and an (N−M)-MSB adder, connected by a single-bit carry signal. The MSB adder can then be retimed into the next stage (see FIG. 20), which leaves significant timing slack at the MSB end-points of the first stage, hence significantly reducing the probability of timing errors at the MSB end-points. This could be viewed as a mixed number system with non-redundant LSBs and carry-save MSBs.

There are a number of drawbacks with this approach. The first is that the retiming example is often somewhat illusory since the retiming of the MSB adder into the next stage has the effect of unbalancing the next stage. If the next stage was previously balanced before the retiming operation, it now almost certainly has a probability of errors that is skewed towards the MSBs. This may or may not be an issue depending on the application. The second issue is that the number of registers needed for the (N−M)-MSBs is more than double, since we need to register both input operand bits and the intermediate carry signal, instead of just the sum bits.

Figure 21:
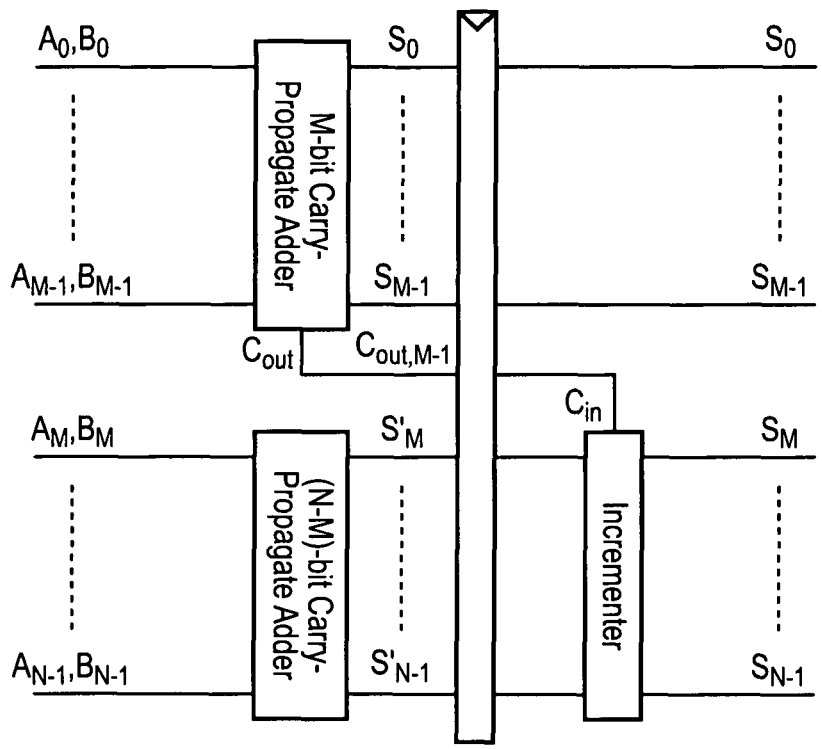
FIG. 21 schematically illustrates retiming of a CPA by using two separate carry chains and broadcasting the intermediate carry out into the MSBs using an incrementer, which is moved across the register boundary.
Figure 22A:
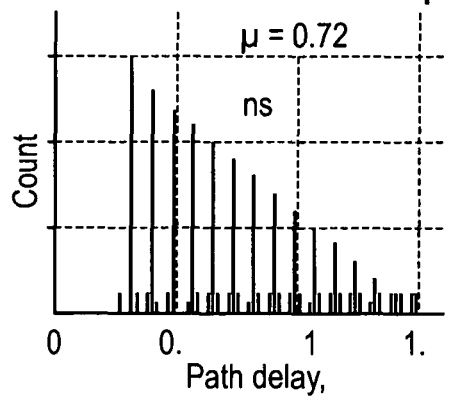
FIG. 22 shows histograms (left) and distribution of path delay across sum bits (right) of different adder topologies implemented in 32 nm CMOS technology.
Figure 22A:
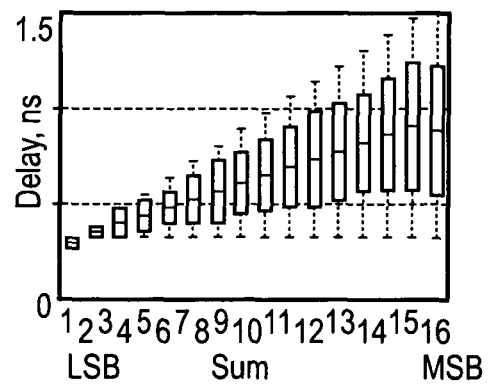
Figure 22B:
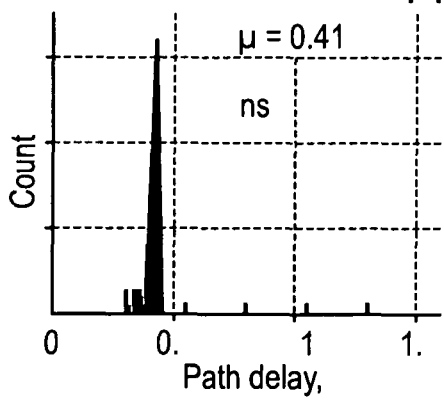
Figure 22B:
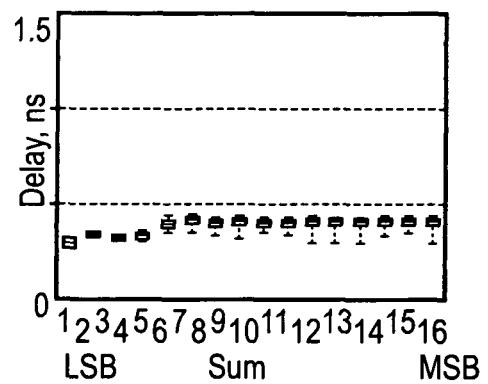

An improved version of the retiming approach is illustrated in FIG. 21. Here, the carry-propagation is evaluated in two separate chunks, before broadcasting the carry out from the LSBs to the MSBs using an incrementer, which is retimed into the next cycle. To ensure timing slack at the (N−M)-MSB end-points, it is necessary to ensure M<N/2, or that a faster graph is used for the MSB adder. The overhead of the incrementer in the following stage is minimal, since the required logic depth is modest. Also, only one additional register is required for the intermediate carry out signal.

Figure 20:
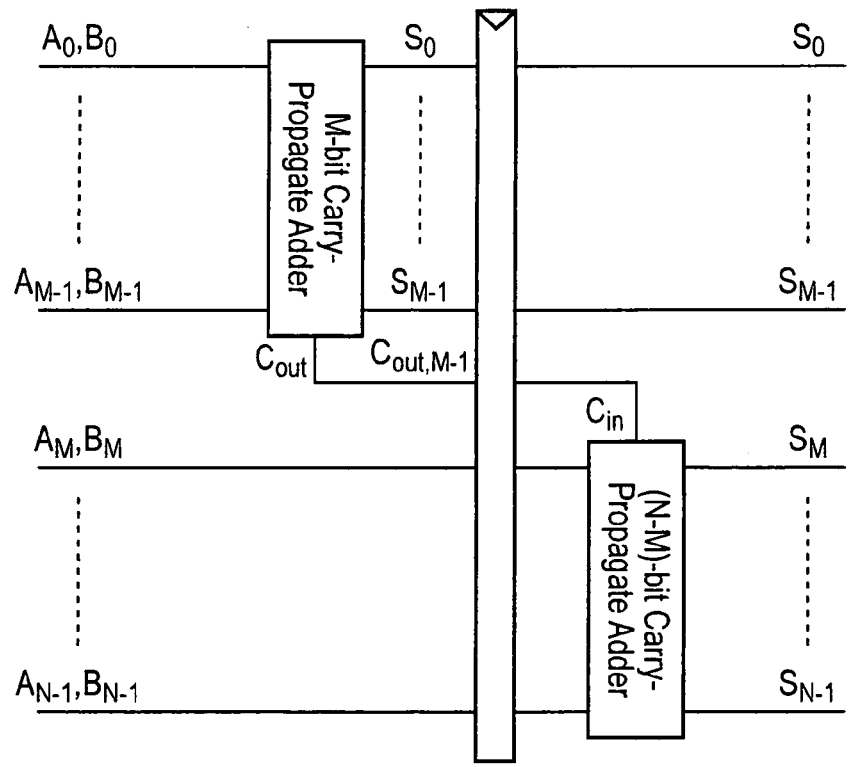
FIG. 20 schematically illustrates retiming of a carry propagate adder (CPA) by splitting the carry chain and moving the upper portion of the logic across the register into the next stage, leaving timing slack to the MSB end-points thereby effectively using carry-save representation for the MSBs.

The main drawback with the approach of FIG. 20 is that the two adders are separate structures with no logical inter-dependencies and therefore are subject to local variability effects, which require careful worst-case margining. Also, as before, the presence of the incrementer in the next cycle also complicates timing somewhat for the next logic stage, although to a lesser extent than with FIG. 8. If an operation requiring carry-propagation exists in the next cycle (such as magnitude comparison), the incrementer can be introduced as a single broadcast row in the graph.

Carry-propagate adders typically dominate the delay imbalance of the majority of arithmetic operations, including subtraction, increment/decrement, magnitude comparison and multiplication. The distribution of path delay in these circuits is an explicit illustration of the logic end-points that are most susceptible to errors due to timing violations. Therefore, by analysing and later engineering the path delay distribution the robustness of the circuit can be increased. The ripple-carry adder (RCA) and Kogge-Stone adder (KSA) are examined below, which are both pareto-optimal in delay and area, in order to gain insight into the characteristics of timing errors in arithmetic logic. The KSA has minimum logic depth and fan-out, resulting in high performance and large area, whereas the RCA has minimum area and low performance. These topologies are well-studied in the literature, both in conventional operation and in sub-critical operation, so for the sake of brevity, the following will focus specifically on path delays.

FIG. 22 shows the results of an analysis using a commercial static timing analysis tool operating on the post-layout netlist annotated with extracted parasitics and observing signal crosstalk effects. The plots on the left show the distribution of all paths in the RCA and KSA, plotted on identical axis; on the right, the distribution is plotted for each end-point.

The following observations of the path delay distribution analysis are instructive:

1. The critical path of the RCA (1.49 ns) is over three times that of the KSA (0.45 ns) and has nearly half the mean delay. This is a large advantage in speed, which can be traded for reduced power dissipation at iso-frequency.
2. For all three circuits, the critical paths are in the MSBs; timing errors from sub-critical operation will generate logic errors of large magnitude, starting with sign-bit failure.
3. The RCA has a significant variation in path length, such that the fastest paths are many times shorter than the critical paths. This results in data-dependent timing errors. The KSA circuit however, has an order-of-magnitude lower standard deviation and therefore the data-dependency of timing errors is much less pronounced.

These observations motivate a general approach for shaping the slack histogram to give fast arithmetic logic which when operated at a marginally sub-critical operating point generates logic errors which are of small magnitude in a mean-squared-error sense.

Circuit-Level Error Mitigation Approach

With circuit-level in situ error detection, errors can be detected equally in any bit position, unlike with ANT approaches which require the timing errors to effect high order MSBs. Therefore, fast minimal logic depth topologies may be exploited such as the KSA, without consideration for delay monotonicity with bit order. Further, a good path delay distribution for a DSP system with error correcting mechanisms would also ensure that intermittent timing errors due to DVS loop undershoot generate logical errors of small magnitude. This would ensure that marginally sub-critical timing errors have a minimal effect on algorithmic performance, in a mean-squared-error sense.

In order to bound the error magnitude of timing-errors over a given guard-band, a small amount of cycle time may be traded for significantly increased robustness at low area overhead. This is achieved by first separating the N-bit pipeline stage into two groups; one group of M LSBs, which will be considered speculative and one group of (N−M) MSBs which will be non-critical by design. In this work, M is chosen heuristically to achieve the desired degree of robustness to timing errors.

A timing guard-band between the longest path to the LSB group end-points ($t_{d,max,LSBs}$) and the longest path to the MSB group end-points ($t_{d,max,MSBs}$) is ensured by a combination of techniques:
1. increased setup time of Razor (error detecting/correcting) vs. conventional flip-flops,
2. a modified final-stage carry-merge addition graph, and
3. tool-based device sizing.

Figure 23:
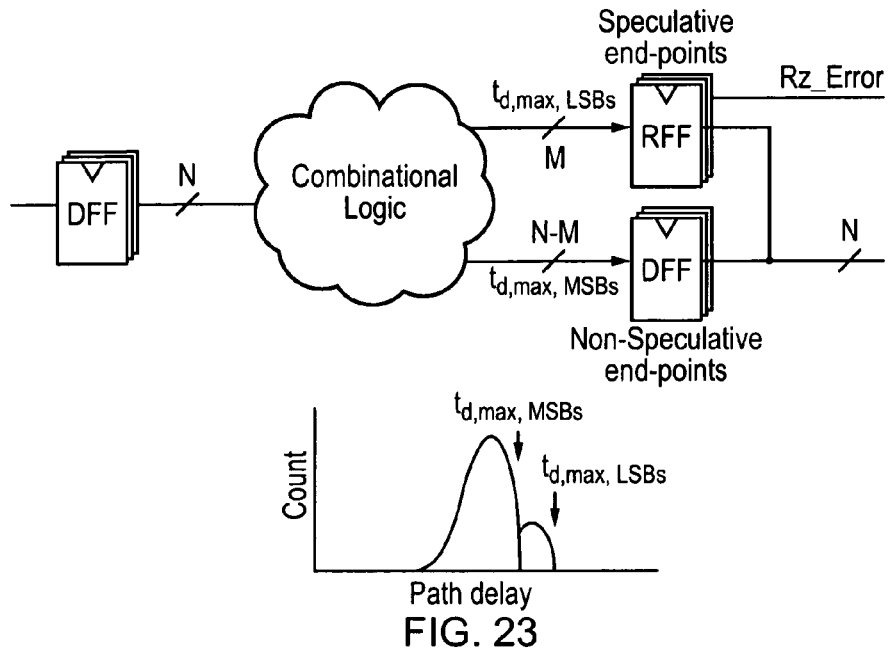
FIG. 23 illustrates logic stage with assignment of speculative end-points in LSBs and corresponding diagrammatical slack histogram.

FIG. 23 illustrates the general approach, where the speculative end-points are sampled by Razor flip-flops ("RFF") and the non-speculative end-points are sampled by conventional flip-flops ("DFF"). The diagrammatical path delay histogram shows the resultant small tail of critical paths which correspond to the LSBs of the N-bit result.

Modelling Timing-Error Noise

The upper-bound for a N-bit arithmetic logic stage is given simply by assuming all the M speculative end-points have failed. Further, a failed speculative end-point cannot effect the sign-bit, so timing errors are ideally distributed symmetrically around a zero mean, i.e.

$$\mu_e = 0, \quad (1)$$

and hence in the worst case, the timing error noise for the $i^{th}$ logic stage, $e_i[n]$, is bounded by $$-2^{(M-1)} \leq e_i[n] \leq 2^{(M-1)}. \quad (2)$$

Over k datapath stages, the total noise contribution, e[n], is $$e[n] = \sum_{i=0}^{k-1} e_i[n], \quad (3)$$

and the variance, $\sigma_e^2$, which is equal to the average power over N samples, is $$\sigma_e^2 = \frac{1}{N} \sum_{n=0}^{N-1} e^2[n], \quad (4)$$

The timing-error noise can be analysed using a simple linear-noise model in order to ascertain its effect at the output. A model of infinite precision is used with an external error input for each register bank that contains speculative end-points. It is assumed that only the speculative end-points are subject to sub-critical timing violations and that sufficient DVS loop bandwidth exists to vary the operating point in response to a non-zero timing error rate, before non-speculative end-points are compromised. The non-linear timing error noise is modeled in a linear fashion given the following assumptions:
1. $e_i[n]$ is an additive white-noise process, with assumed zero-mean distribution.
2. $e_i[n]$ is a wide-sense stationary random process, i.e. mean and co-variance of e[n] are independent of time index n.
3. $e_i[n]$ is assumed to be uncorrelated to all other signals, such as input signals and other noise signals.

Analytical analysis of the variance of the distribution, $\sigma_e^2$ is difficult since it is in general a function of the path delay distribution, the path activation distribution and the prevailing operating point for the speculative end-points. Thus, we leave this for future work.

Linear-Phase Filter Case Study

To investigate the circuit-level error mitigation approach, we implemented a digital filter datapath in a 32 nm CMOS process.

Optimised FIR Signal Flow Graph

To reduce the timing error power, it is important to optimize the VLSI architecture. The SNR at the output of a digital filter with the proposed circuit-level error mitigation approach is $$SNR_o = \frac{\sigma_s^2}{\sigma_n^2 + \sigma_e^2} \quad (5)$$

where $\sigma_s^2$ is the power of the input signal, $\sigma_n^2$ is the power of the residual noise after attenuation by the filter, and $\sigma_e^2$ is the timing error noise contribution. Assuming the ratio of $\sigma_s^2$ to $\sigma_n^2$ at the output is fixed by the input signal statistics and the filter specification, we wish to optimize $SNR_o$ under sub-critical operation by minimizing $\sigma_e^2$. This can be achieved by minimizing the number of datapath stages, i, and the number of speculative bits per stage, M. In this section we will seek to optimize the former.

Figure 24:
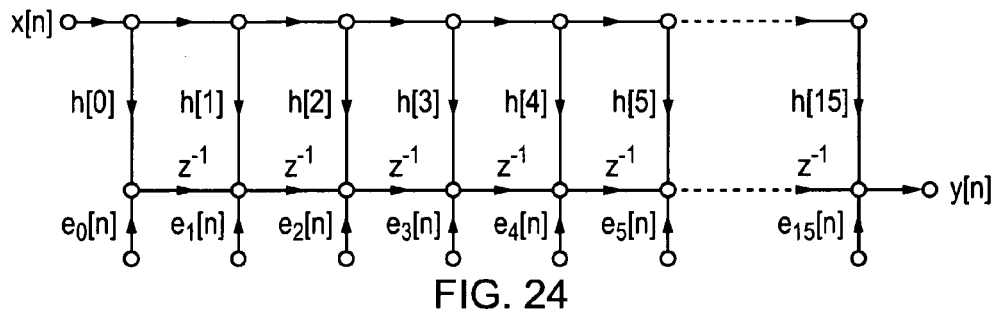
FIG. 24 shows signal flow graph for conventional 16-tap transposed direct form with noise sources $e_i[n]$.
Figure 25:
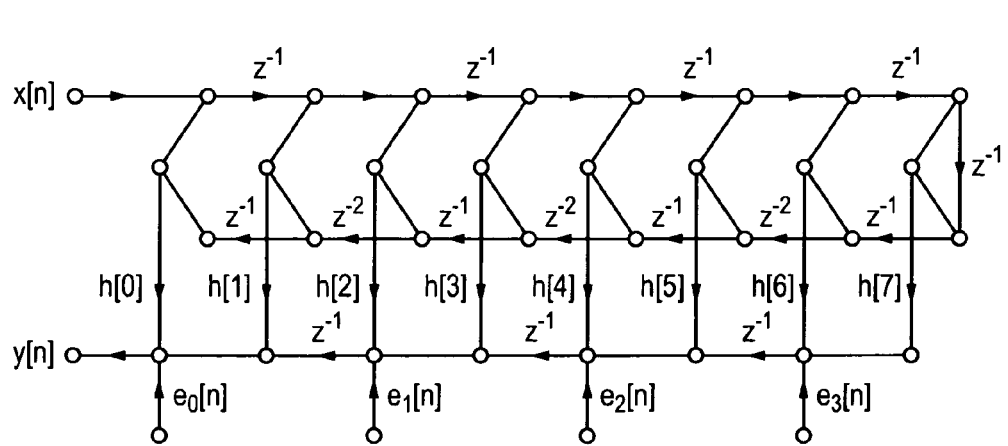
FIG. 25 shows signal flow graph for a 16-tap symmetrical direct-form FIR re-timed to minimize the number of i.i.d. timing-error noise sources.

FIG. 24 shows the signal flow graph for the conventional transposed direct-form FIR algorithm for a $15^{th}$-order (16-tap) digital filter, with timing error noise sources added for each datapath stage, according to the linear noise model assumptions. Each tap is a separate multiply-add datapath stage, such that i=16. Since all $e_i[n]$ are assumed to be i.i.d. processes, the maximum timing error noise magnitude at the output of this structure is 16·$e_i[n]$ The transposed direct form FIR architecture may be modified to reduce the maximum timing error magnitude in two ways. Firstly, the symmetric direct-form may be used which reduces the number of carry-propagations (and therefore halves the number of timing-error noise sources) while also ensuring phase-linearity is preserved in the presence of timing-errors. Secondly, this structure may be retimed along a feed-forward cutest to combine two symmetric taps in each logic stage, thereby reducing the maximum timing error noise contribution by half again, to 4−$e_i[n]$, as shown in FIG. 25.

Figure 26:
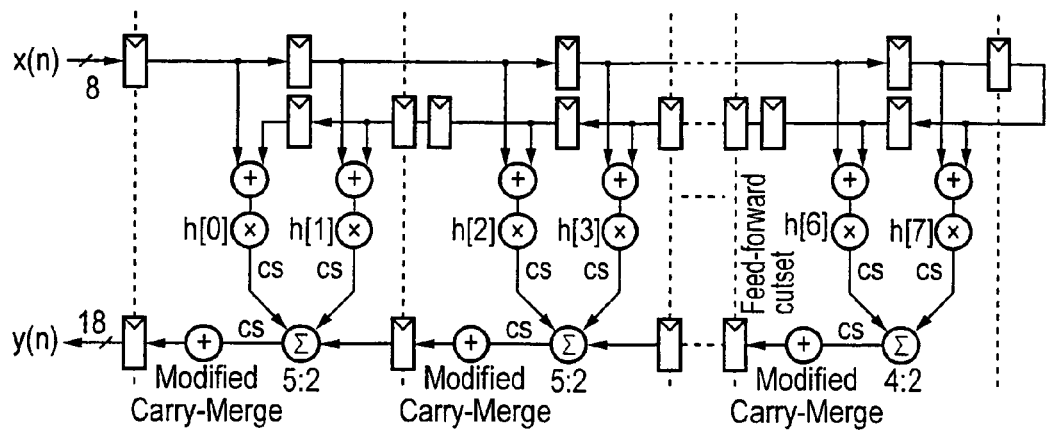
FIG. 26 illustrates the architecture of 16-tap symmetrical retimed direct form FIR with carry-save representation for intermediate signals being noted as CS and all other signals being binary two's complement.

The proposed improvements may be applied to a 16-tap FIR filter, resulting in the VLSI architecture shown in FIG. 26. This employs 8-bit coefficients, 8-bit input data words and an 18-bit adder chain. Sufficient precision has been allowed for intermediate signals to allow word growth without truncation, such that the entire error contribution is due to bounded razor errors. The proposed features reduce throughput, but this is not significant due to the fact that the longer the arithmetic logic path, the more operations can be performed in redundant arithmetic representation, which leads to less carry-propagations. There is significant potential to improve further for bounded timing-errors at the algorithm-level. For example, it is possible to obtain a cascade form for FIR systems by factoring the polynomial of the system function, such that timing-error noise from the early stages is attenuated by subsequent stages.

VLSI Implementation

The proposed approach relies on achieving a small guard-band between $t_{d,max,LSBs}$ and $t_{d,max,MSBs}$ across the design. The following explains how this is achieved with reduced impact on area, throughput and power.

Having assigned speculative end-points by instantiating Razor flip-flops to the LSB group, the delay is naturally increased due to the greater setup time of a Razor flip-flop compared to a conventional flip-flop. In well balanced designs, this may be sufficient, along with suitable timing constraints in the implementation flow, to achieve the desired timing guard-band. However, in the described implementation, the guard-band is further increased by using a modified final stage merge adder topology, at low overhead.

As shown in FIG. 26, each tap of the proposed architecture uses carry-save arithmetic for the sum-multiply-sum operations with a final carry-merge to avoid double-width registers. The carry-save logic is generally well balanced, such that the majority of the imbalance is dominated by the final carry-propagation in the merge-adder. To take advantage of this, there is proposed a novel hybrid parallel prefix graph for the 18-bit carry-merge adder that combines an 8-bit linear-delay adder with a truncated 18-bit Sklansky adder in the same prefix network. The linear-delay stage has a chain-like structure that evaluates the carry in O(M) time, whereas the minimal depth Sklansky tree achieves a critical path of O($\log_2 N$) time. Combining the two structures such that M≥$\log_2 N$, results in a generally balanced path delay profile with a small tail of critical paths due to the ripple-carry adder in the LSB positions.

Figure 27:
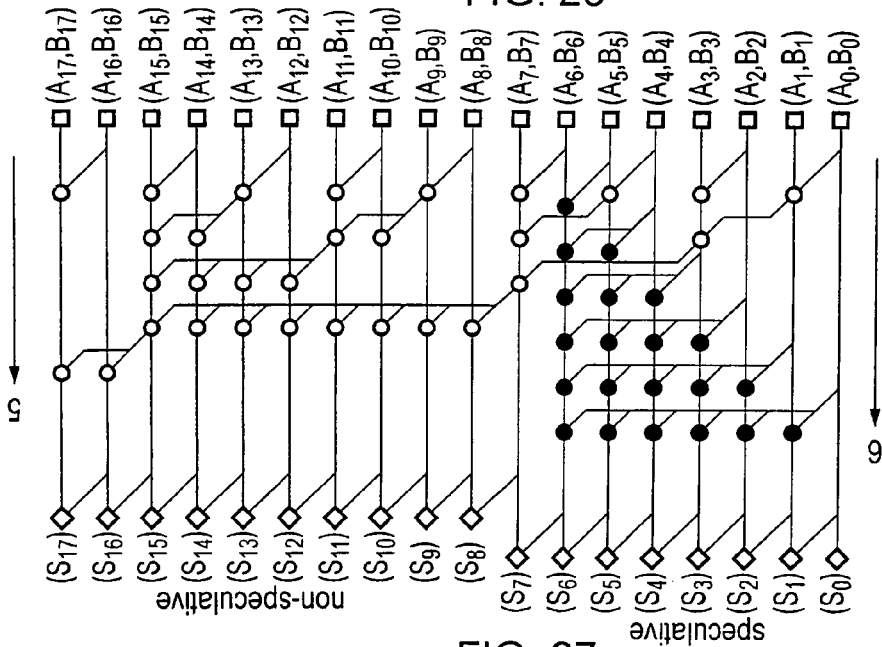
FIG. 27 illustrates a hybrid parallel-prefix addition graph based on Sklansky tree where M=8, N=18 and black and grey operators are on separate trees, but sharing initial $\{P_i, G_i\}$ bits.

FIG. 27 illustrates the modified carry-merge adder, with well-know logical construction for propagate-generate (□), dot-operator (●) and sum operator logic (◇). The input operands to the carry-merge adder are not quite of equal arrival time since the compressor tree following the multiplication is deeper in the center than at either edge. This is taken into account by ensuring the critical path for the speculative bits starts near to the center, as opposed to from the LSB, which is the case with a conventional ripple-carry.

Overheads of Proposed Approach

To provide a context for the results presented in the next sub-section, a tentative comparison is made to a conventional unmodified implementation at iso-frequency. Since this conventional implementation has neither a replay mechanism or is designed for robustness to timing-errors, it is not possible to apply DVS driven by in situ timing error rate to such a design. Therefore, for a fair comparison, the power consumption of this conventional implementation is taken with the full design-margin (i.e. at Vdd=1 V). In the case of the proposed implementation, the overhead of all external support circuitry required for DVS. Is ignored.

Simulation Results

Post-layout HSIM simulation with extracted parasitics was used to evaluate the proposed architecture over a range of supply voltage scaling conditions and process/temperature corners. The coefficients used for the simulations are for a symmetric low-pass response with normalized cut-off frequency, $\omega_c = \pi/2$ radians/sample. 10,000 input vectors, consisting of uniform noise samples with maximum amplitude of 0 dBFS, were used to test the filter amplitude response up to the Nyquist frequency.

The minimum clock period at the slow corner was found using conventional static timing analysis to be 2.4 ns (420 MHz). This clock period was kept constant while the supply voltage was scaled down from the process nominal of 1 V. To gauge the algorithmic performance of the proposed filter we employ a measure of stop-band rejection. Stop-band rejection is conventionally defined as the attenuation (from pass-band) to the top of the first side-lobe of the amplitude response. However, this metric is inaccurate in our case since the amplitude response becomes somewhat distorted in the presence of logic errors. Therefore, we use a modified approach of calculating the stop-band attenuation, η, as the ratio of pass-band power to stop-band power, both of which are defined as integrals of the power spectral density, Φ(ω);

$$\eta = 10 \cdot \log_{10}\left(\frac{\int_0^{\omega_c} \Phi(\omega) \cdot d\omega}{\int_{\omega_c}^{\pi} \Phi(\omega) \cdot d\omega}\right) \quad (6)$$

This gives an averaged measure of frequency selectivity, which is appropriate for describing algorithmic performance. For the sake of brevity we will only consider DVS, but similar conclusions can be reached for DFS and DVFS also.

Figure 28:
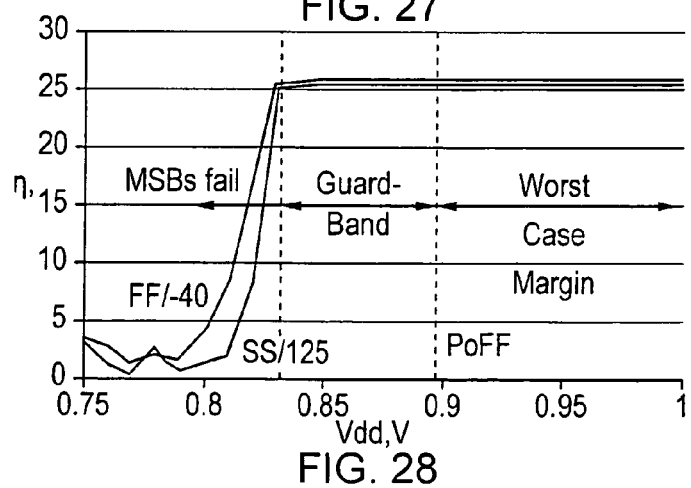
FIG. 28 illustrates stop-band attenuation vs. supply voltage at slow (SS/125° C.) and fast (FF/−40° C.) corners.
Figure 29:
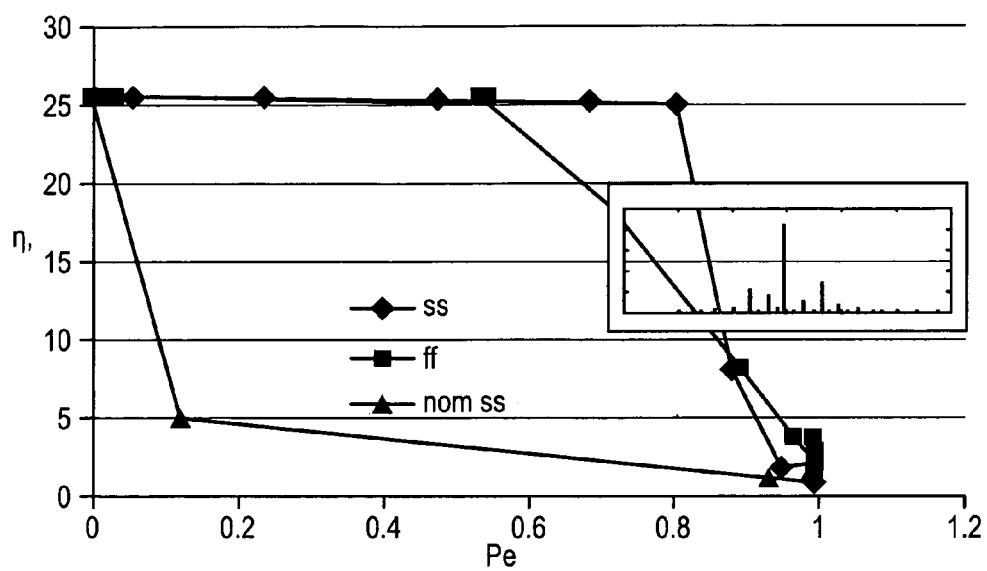
FIG. 29 illustrates stop-band attenuation vs. probability of error. Distribution of timing errors (inset)
Figure 30:
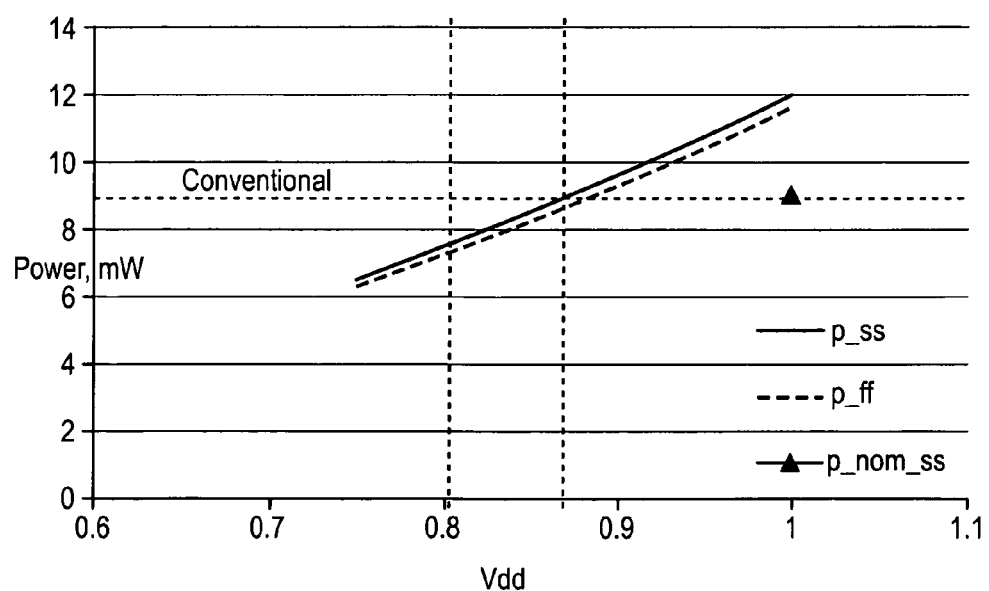
FIG. 30 illustrates power dissipation vs. supply voltage for proposed and conventional.

The preliminary simulated results are illustrated in FIGS. 28, 29 and 30.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data comprising:
   processing circuitry configured to perform one or more processing operations to generate a result value, said processing circuitry operating under a set of operating parameters, said processing circuitry having:
   (i) an error resistant portion configured to have a first probability of an error in operation for said set of operating parameters; and
   (ii) an error prone portion configured to have a second probability of an error in operation for said set of operating parameters, said first probability being lower than said second probability;
   error detection circuitry coupled to said error prone portion of said processing circuitry and configured to detect an error in operation of said error prone portion corresponding to at least one bit of one or more bits of said result value generated by said error prone portion having an incorrect value; and
   parameter control circuitry coupled to said error detection circuitry and configured to adjust one or more of said set of operating parameters to maintain a non-zero error rate in errors detected by said error detection circuitry; wherein
   said one or more bits of said result value generated by said error prone portion are such that any error therein is tolerated and said apparatus continues operation without said error prone portion correcting said error.

2. Apparatus as claimed in claim 1, wherein said result value is an N-bit result value comprising a plurality of bits of different arithmetic significance, where N is greater than one, and said error resistant portion generates a most significant bit field of said result value having Z bits, where Z is greater than or equal to one.

3. Apparatus as claimed in claim 2, wherein said error prone portion generates one or more bits of said N-bit result value outside said most significant bit field.

4. Apparatus as claimed in claim 2, wherein said error prone portion generates a least significant bit field of said result value, said least significant bit field having M bits, where M is greater than or equal to one and M+Z is equal to N.

5. Apparatus as claimed in claim 1, wherein said result value comprises two or more bits and represents a numeric value using a numeric coding scheme.

6. Apparatus as claimed in claim 5, wherein said numeric coding scheme is a floating point number coding scheme such that said result value includes an exponent value and a mantissa value and at least said exponent value is generated by said error resistant portion.

7. Apparatus as claimed in claim 1, wherein said result value is a unit code.

8. Apparatus as claimed in claim 1, wherein at least one bit of said result value generated by said error prone portion is a redundant bit corresponding to a bit of said result value that is also generated by said by said error resistant portion.

9. Apparatus as claimed in claim 1, wherein said error resistant portion comprises a plurality of transistors, said error prone portion comprises a plurality of transistor and transistors within said error resistant portion are bigger than equivalent transistors within said error prone portion.

10. Apparatus as claimed in claim 9, wherein said error resistant portion operates more rapidly and has a lower probability of a timing error.

11. Apparatus as claimed in claim 9, wherein said error resistant portion has a lower probability of a soft error.

12. Apparatus as claimed in claim 1, wherein said result value is a multi-bit result, said error resistant portion is configured with a first micro-architecture to generate a first field of said multi-bit result and said error prone portion is configured with a second micro-architecture to generate a second field of said multi-bit result, said first micro-architecture being different from said second micro-architecture and said first field being discrete from said second field.

13. Apparatus as claimed in claim 12, wherein said processing circuitry is adder circuitry.

14. Apparatus as claimed in claim 13, wherein said first micro-architecture is a parallel-prefix graph micro-architecture and said second micro-architecture is a serial-prefix graph micro-architecture.

15. Apparatus as claimed in claim 1, wherein said processing circuitry is configured such that manufacturing variations in said processing circuitry result in a maximum change in a probability of an error in operation for said set of operating parameters that is less than a difference between said first probability and said second probability.

16. Apparatus as claimed in claim 1, wherein said set of operating parameters include at least one of:
(i) a voltage of a power supply to said processing circuitry; and
(ii) an operating frequency of a clock signal controlling operation of said processing circuitry.

17. Apparatus as claimed in claim 1, wherein said one or more processing operations are performed upon at least one input operand having a noise component.

18. Apparatus as claimed in claim 1, wherein said one or more processing operations are one or more of:
(i) image data processing operations;
(ii) audio data processing operations;
(iii) graphics data processing operations; and
(iv) wireless signal processing operations.

19. Apparatus as claimed in claim 1, wherein said error prone portion includes one or more buffer circuits configured to delay generation of said one or more bits of said result value generated by said error prone portion.

20. Apparatus as claimed in claim 1, wherein said processing circuitry comprises a plurality of processing stage and said error resistant portion extends over a greater number of said plurality of processing stages than said error prone portion.

21. Apparatus for processing data comprising:
processing means for performing one or more processing operations to generate a result value, said processing means operating under a set of operating parameters, said processing means having:
(i) an error resistant portion configured to have a first probability of an error in operation for said set of operating parameters; and
(ii) an error prone portion configured to have a second probability of an error in operation for said set of operating parameters, said first probability being lower than said second probability;
error detection means coupled to said error prone portion of said processing means for detecting an error in operation of said error prone portion corresponding to at least one bit of one or more bits of said result value generated by said error prone portion having an incorrect value; and
parameter control means coupled to said error detection means for adjusting one or more of said set of operating parameters to maintain a non-zero error rate in errors detected by said error detection means; wherein
said one or more bits of said result value generated by said error prone portion are such that any error therein is tolerated and said apparatus continues operation without said error prone portion correcting said error.

22. A method of processing data comprising the steps of:
performing one or more processing operations to generate a result value using processing circuitry, said processing circuitry operating under a set of operating parameters;
operating an error resistant portion of said processing circuitry with a first probability of an error in operation for said set of operating parameters;
operating an error prone portion of said processing circuitry with a second probability of an error in operation for said set of operating parameters, said first probability being lower than said second probability;
detecting an error in operation of said error prone portion corresponding to at least one bit of one or more bits of said result value generated by said error prone portion having an incorrect value; and
adjusting one or more of said set of operating parameters to maintain a non-zero error rate in errors detected; wherein
said one or more bits of said result value generated by said error prone portion are such that any error therein is tolerated and said method continues operation without said error prone portion correcting said error.

* * * * *